US009548129B2

(12) United States Patent
Paudel et al.

(10) Patent No.: US 9,548,129 B2
(45) Date of Patent: Jan. 17, 2017

(54) WORD LINE LOOK AHEAD READ FOR WORD LINE TO WORD LINE SHORT DETECTION

(71) Applicant: SanDisk Technologies Inc., Plano, TX (US)

(72) Inventors: Rajan Paudel, Fremont, CA (US); Jagdish Sabde, Fremont, CA (US); Mrinal Kochar, San Jose, CA (US); Sagar Magia, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/919,472

(22) Filed: Oct. 21, 2015

(65) Prior Publication Data

US 2016/0260495 A1 Sep. 8, 2016

Related U.S. Application Data

(60) Provisional application No. 62/127,236, filed on Mar. 2, 2015.

(51) Int. Cl.
*G11C 11/34* (2006.01)
*G11C 16/34* (2006.01)
(Continued)

(52) U.S. Cl.
CPC ........... *G11C 16/3427* (2013.01); *G11C 16/16* (2013.01); *G11C 16/26* (2013.01); *G11C 16/3431* (2013.01); *G11C 16/3445* (2013.01); *G11C 29/50* (2013.01)

(58) Field of Classification Search
CPC ..... G11C 16/0483; G11C 16/16; G11C 16/26; G11C 16/10; G11C 11/5628; G11C 2029/1202; G11C 8/08; G11C 29/50
See application file for complete search history.

(56) References Cited

U.S. PATENT DOCUMENTS 6,307,778 B1 10/2001 Micheloni et al.
6,407,953 B1 * 6/2002 Cleeves ................ G11C 29/24
365/189.09

(Continued)

OTHER PUBLICATIONS

U.S. Appl. No. 14/322,055, filed Jul. 2, 2014.
U.S. Appl. No. 14/500,660, filed Sep. 9, 2014.
U.S. Appl. No. 14/627,575, filed Feb. 20, 2015.

*Primary Examiner* — Son Dinh
*Assistant Examiner* — Uyen B Tran
(74) *Attorney, Agent, or Firm* — Vierra Magen Marcus LLP

(57) ABSTRACT

Techniques are provided for operating a memory device which detect word line short circuits, such as short circuits between adjacent word lines. In an example implementation, during a programming operation, the number of program loops used to complete programming or reach another programming milestone for WLn are counted. If the number of program loops exceeds a loop count limit, the memory cells of WLn+1 are evaluated to determine whether a short circuit is present. The evaluation involves a read operation which counts erased state memory cells in the upper tail of the Vth distribution of WLn+1. If the count exceeds a bit count limit, it is concluded that a short circuit exits between WLn and WLn+1, and a corrective action is taken. The loop count limit is adjusted lower as the number of program-erase cycles increases.

13 Claims, 21 Drawing Sheets

(51) Int. Cl.
*G11C 16/16* (2006.01)
*G11C 16/26* (2006.01)
*G11C 29/50* (2006.01)

(56) References Cited

U.S. PATENT DOCUMENTS

| | | | |
|---|---|---|---|
| 6,781,902 B2 | 8/2004 | Oumiya et al. | |
| 8,693,254 B2 | 4/2014 | Hashimoto | |
| 8,730,722 B2 | 5/2014 | Koh et al. | |
| 8,902,657 B2 | 12/2014 | Iwai et al. | |
| 2006/0291303 A1* | 12/2006 | Kleveland | G11C 29/816 365/200 |
| 2010/0128521 A1* | 5/2010 | Mizuguchi | G11C 16/08 365/185.02 |
| 2014/0032821 A1* | 1/2014 | Lee | G11C 5/145 711/103 |

* cited by examiner

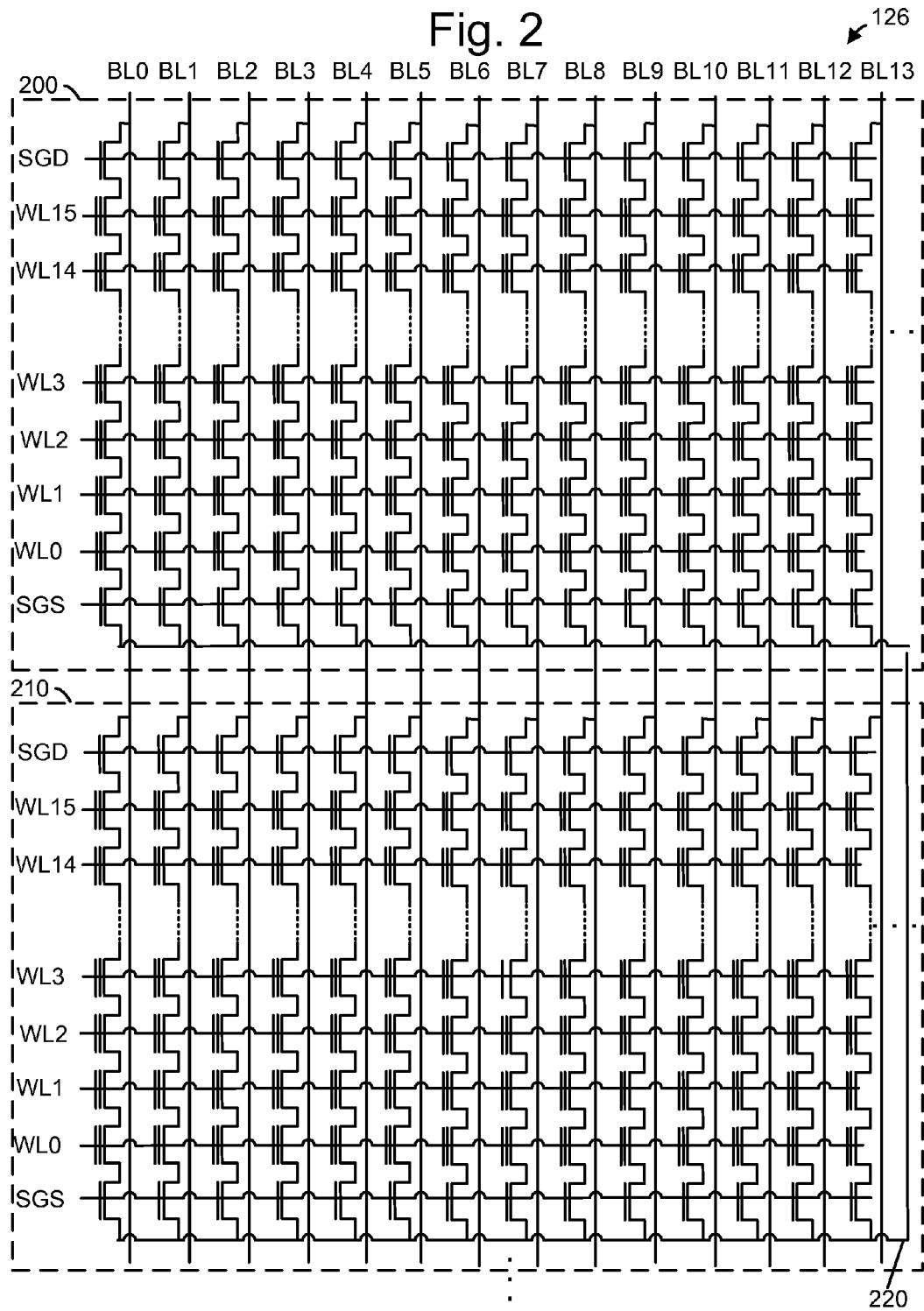

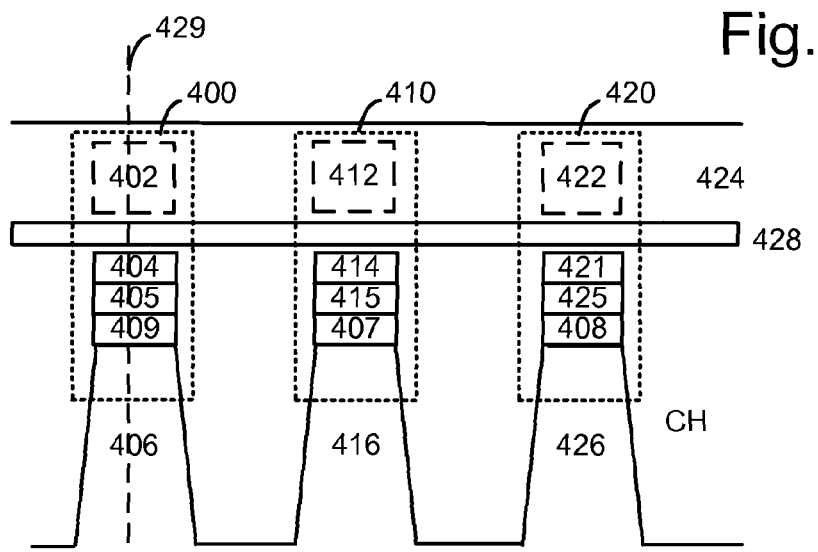
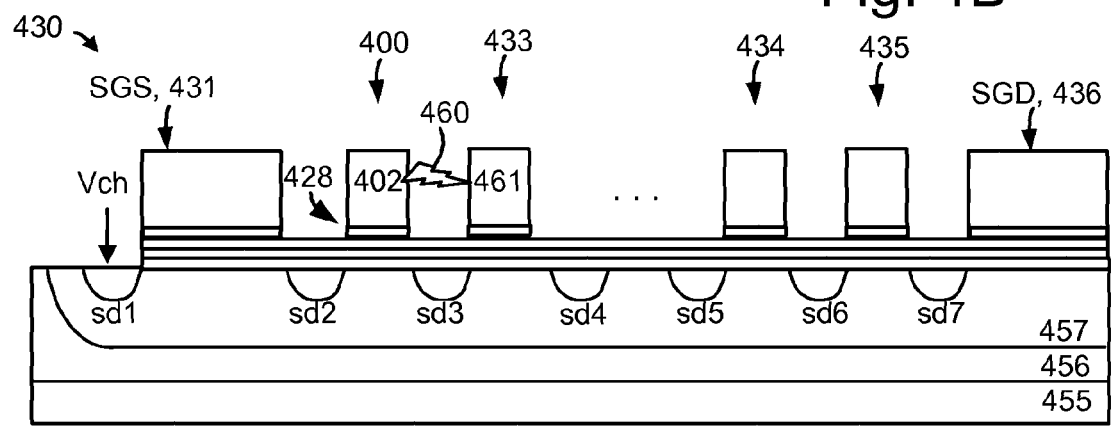

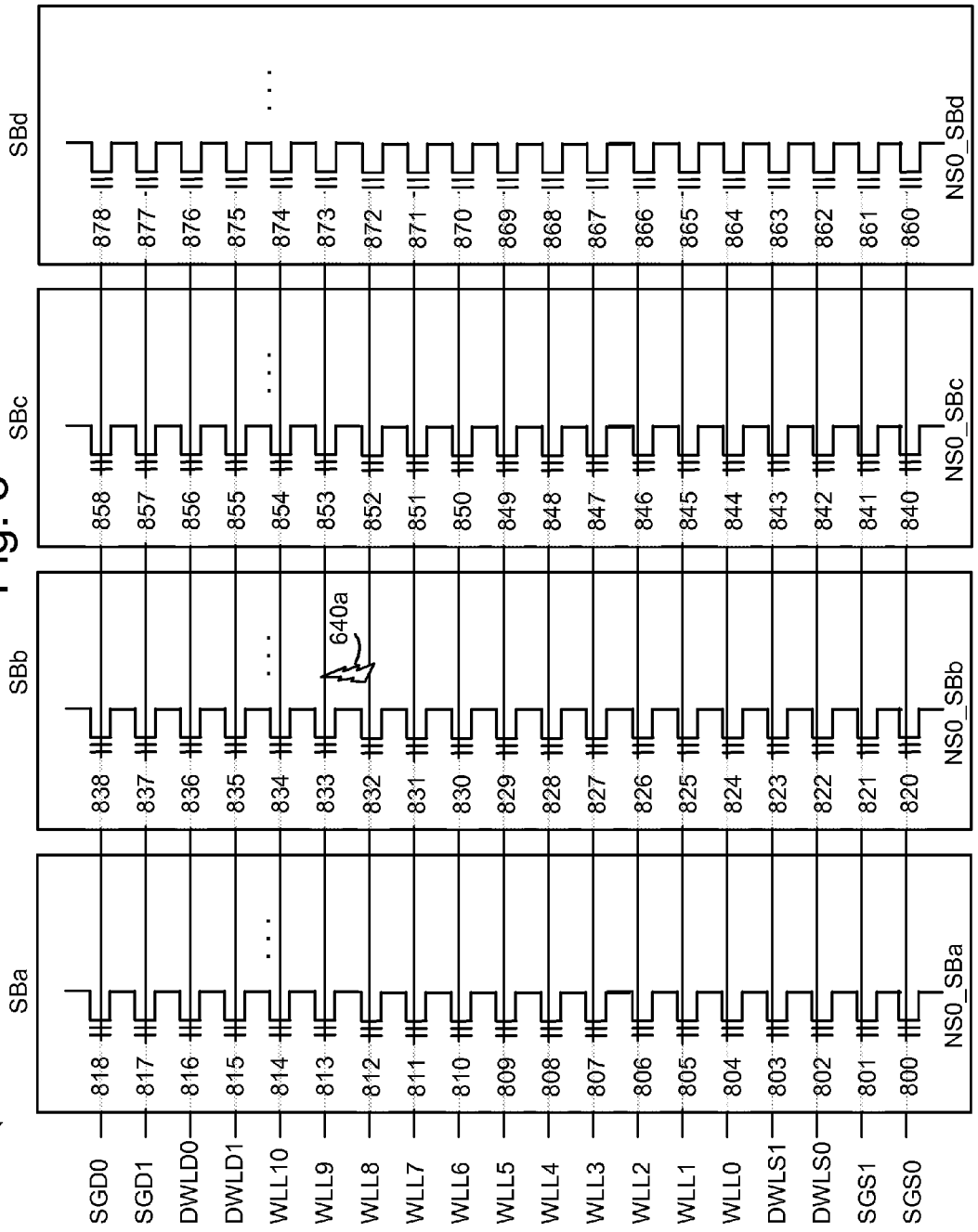

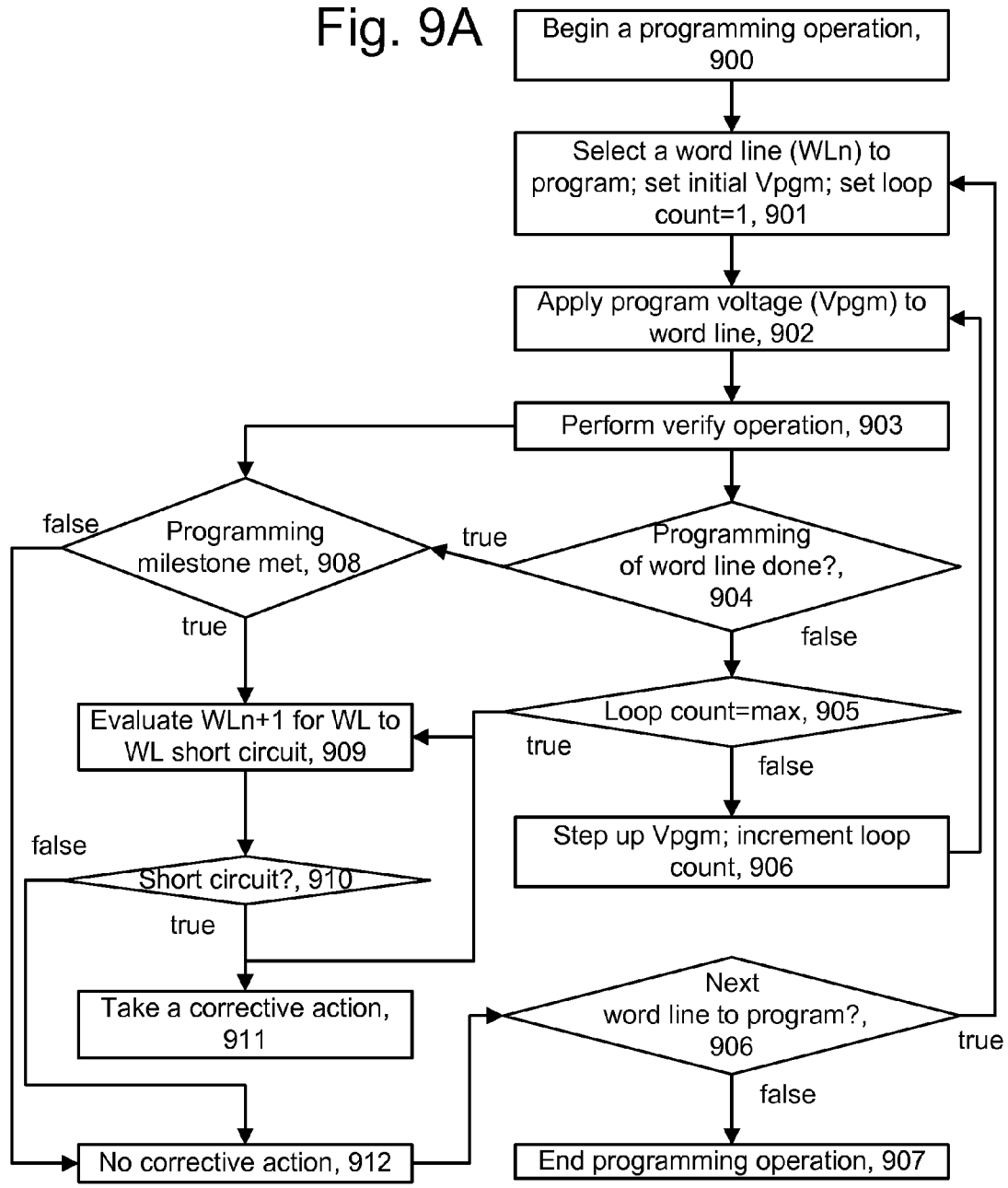

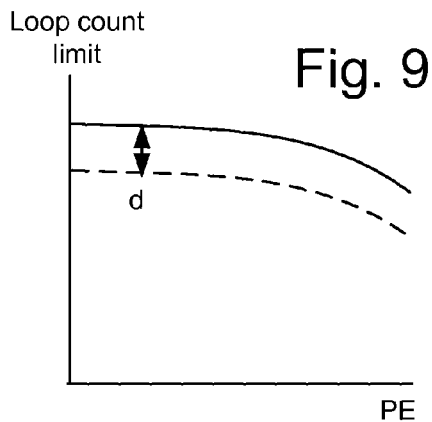
Fig. 9B1
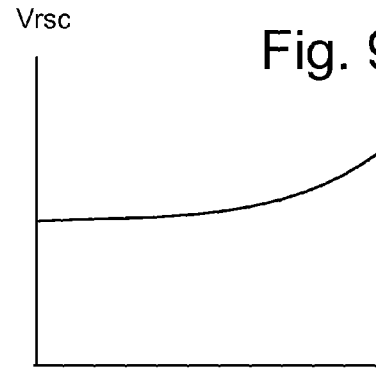
Fig. 9B2
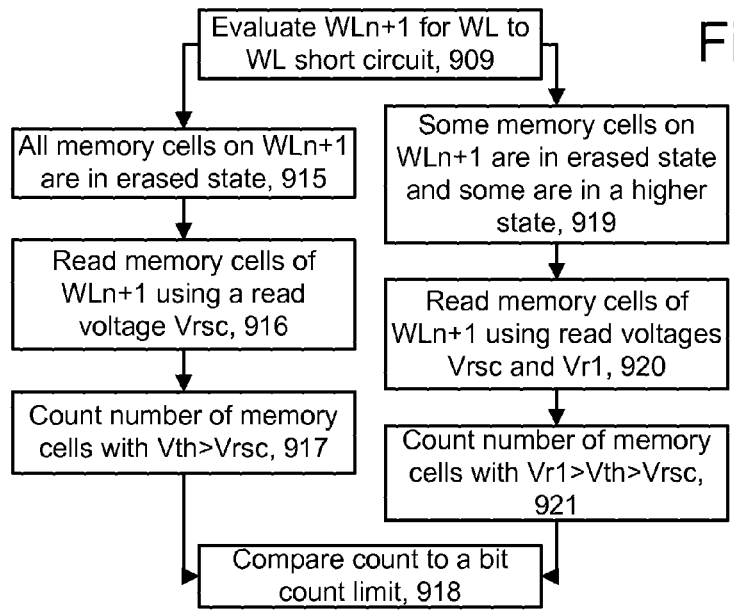
Fig. 9C1
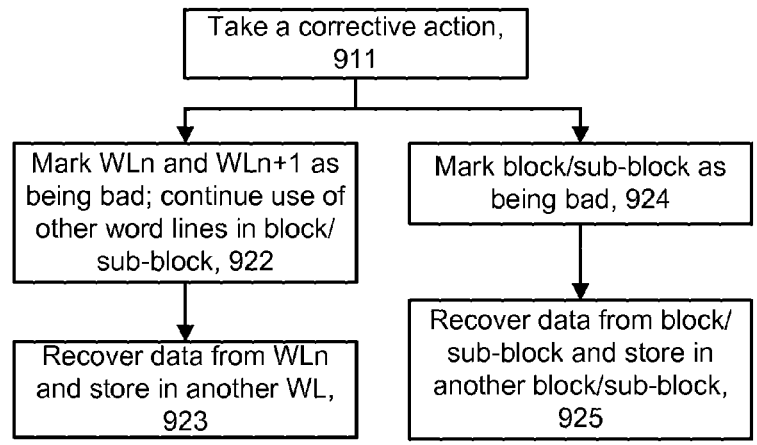
Fig. 9C2

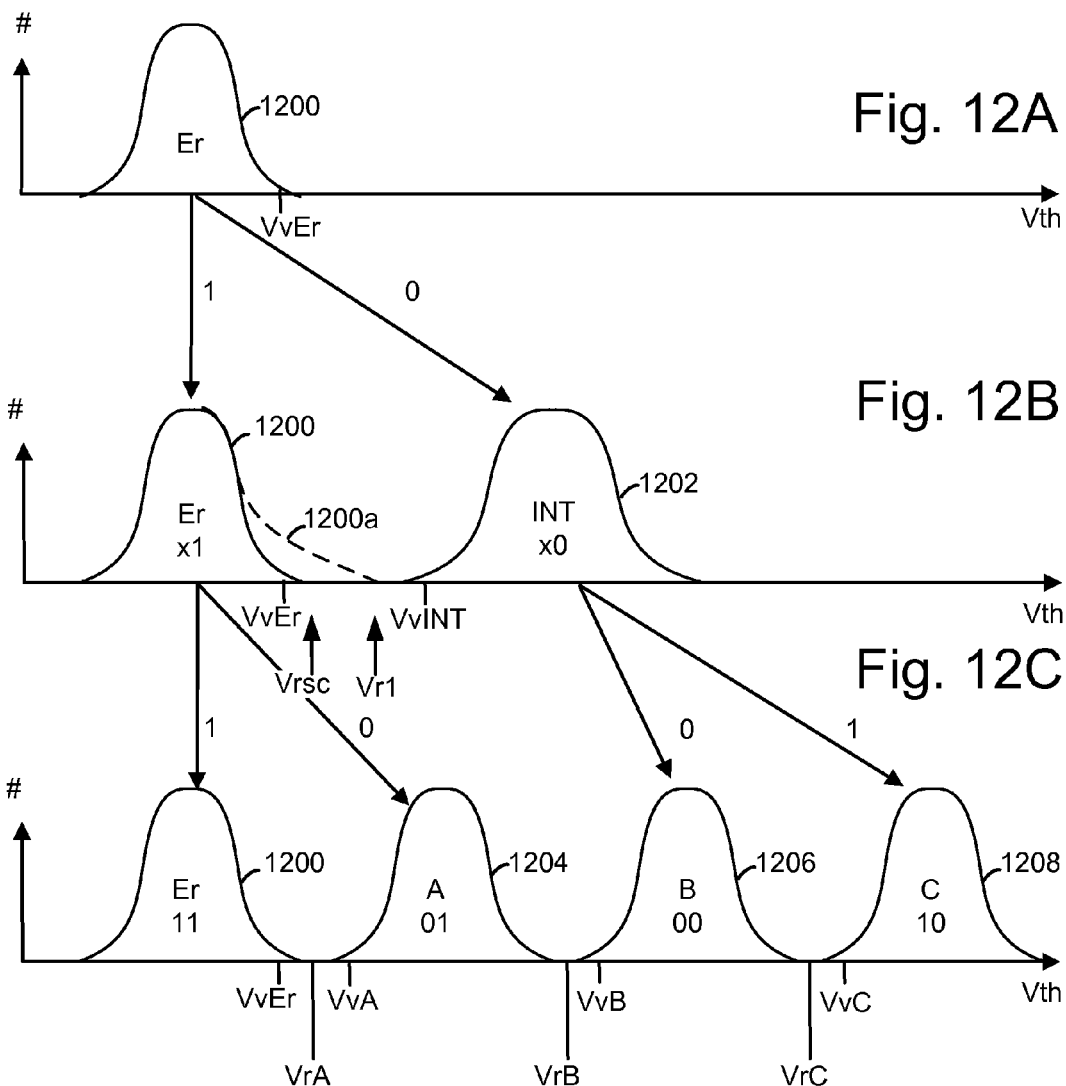

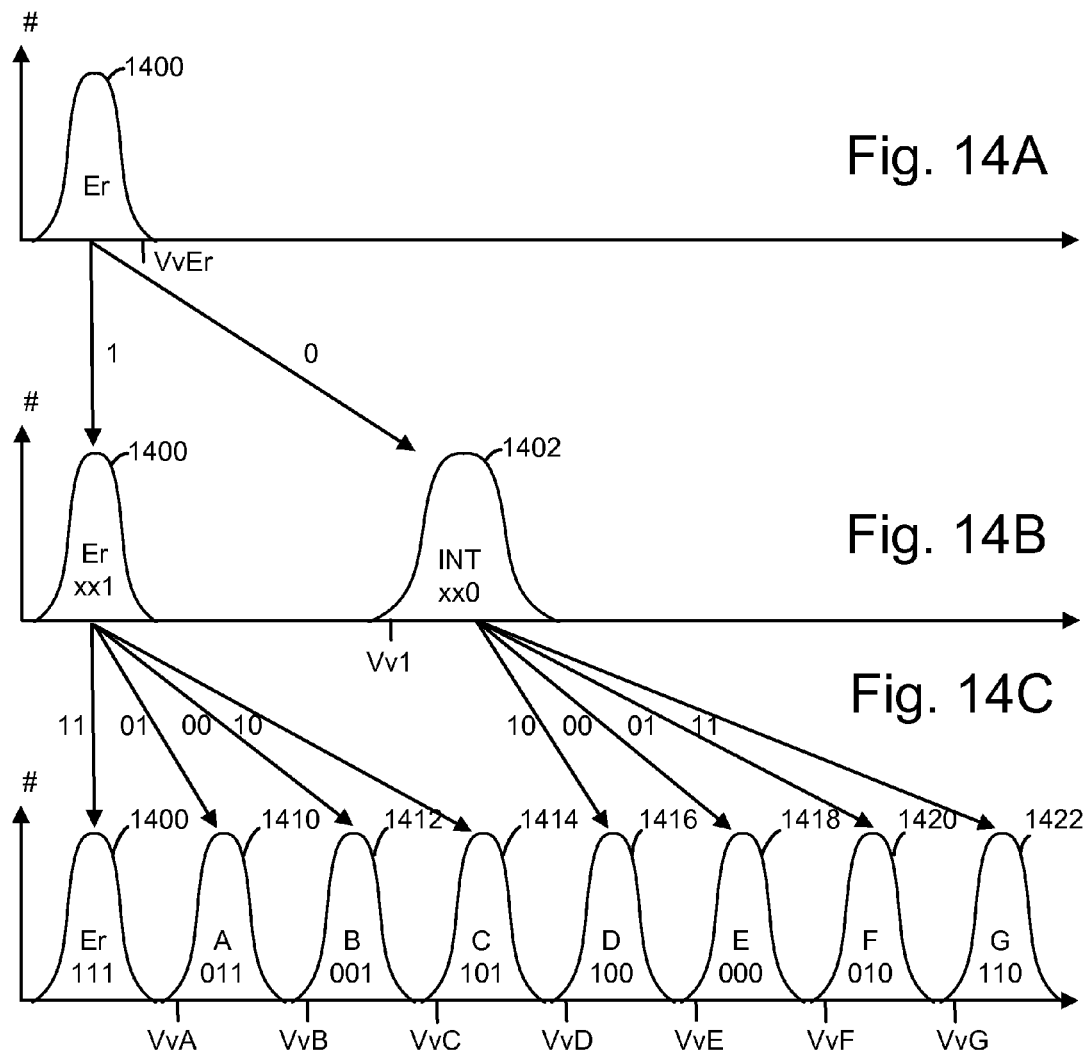

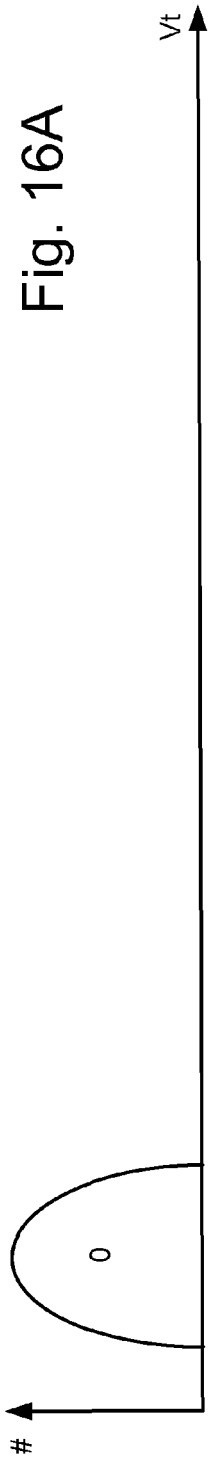
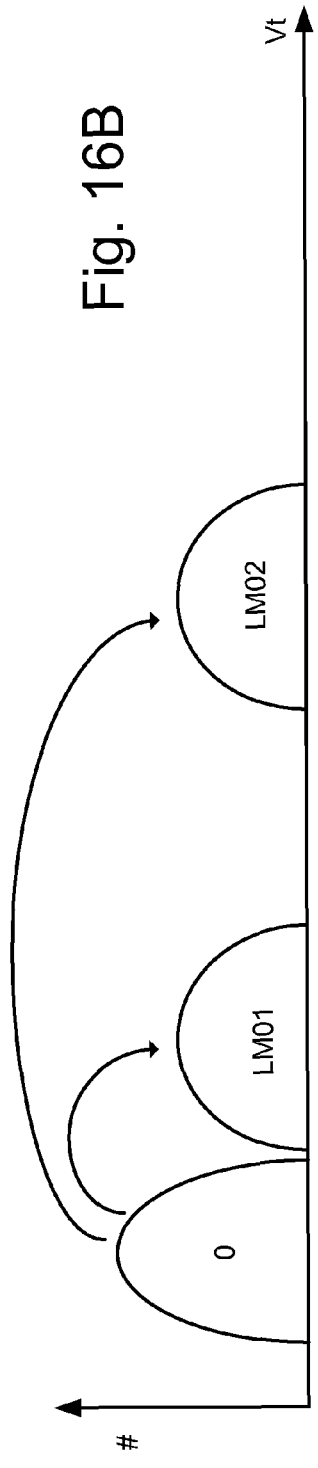
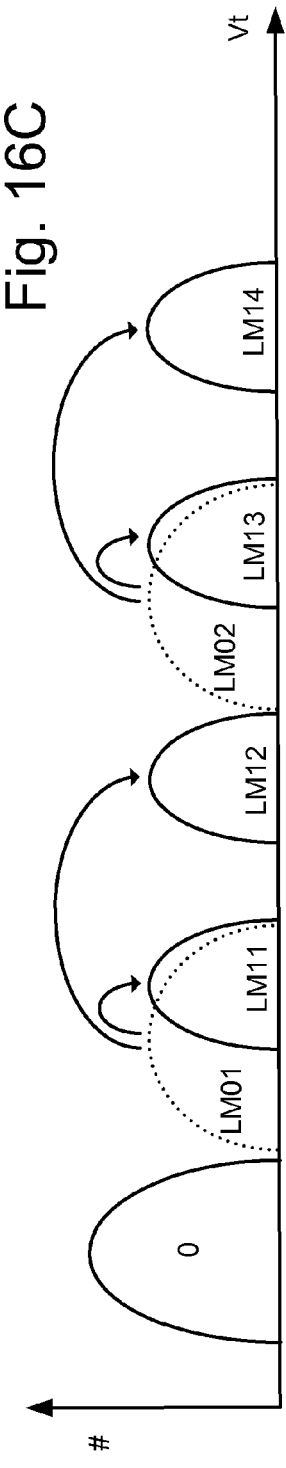

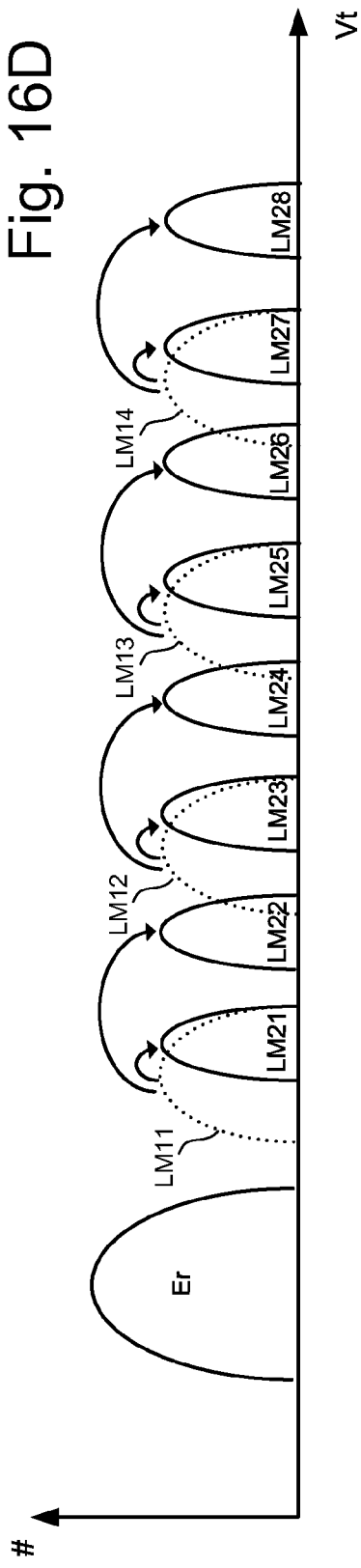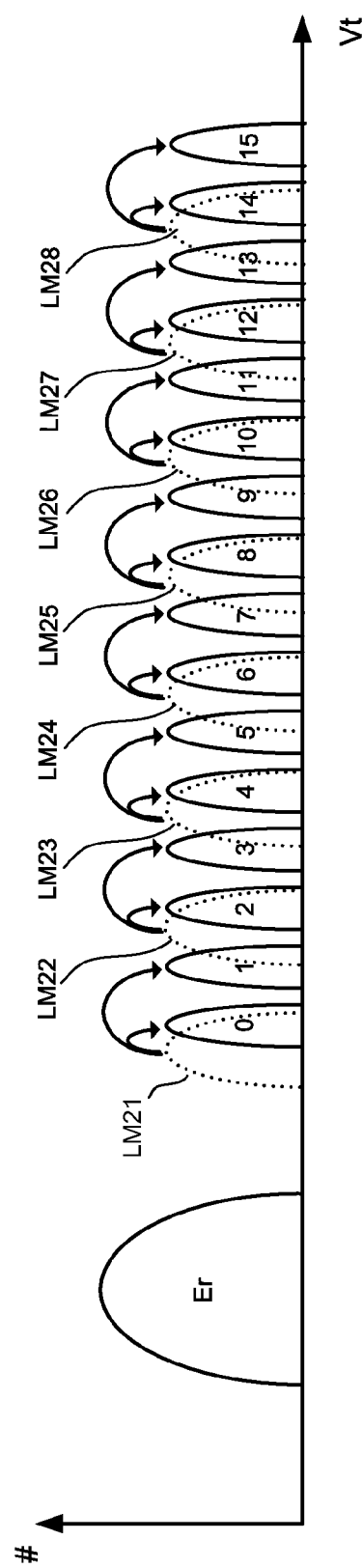

US 9,548,129 B2

WORD LINE LOOK AHEAD READ FOR WORD LINE TO WORD LINE SHORT DETECTION

CLAIM OF PRIORITY

The present application claims priority from U.S. Provisional Patent Application No. 62/127,236, entitled "Word Line Look Ahead Read Proposal For Word Line—Word Line Short Detection In The Field," by Paudel et al., filed Mar. 2, 2015, incorporated by reference herein in its entirety.

BACKGROUND

The present technology relates to operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 2 depicts blocks of memory cells in an example two-dimensional configuration of the memory array 126 of FIG. 1A.

FIG. 4A depicts a cross-sectional view of example charge-trapping memory cells in NAND strings.

FIG. 4B depicts a cross-sectional view of the structure of FIG. 4A along line 429, including an example short circuit.

FIG. 8 depicts example NAND strings in the sub-blocks SBa-SBd of FIG. 7A, including an example short circuit.

FIG. 9A is a flowchart of an example programming operation in a memory device which checks for a short circuit between word lines.

FIG. 9B1 is a plot of a change in a loop count limit as a function of a number of program-erase (PE) cycles.

FIG. 9B2 is a plot of a change in a read voltage Vrsc as a function of a number of PE cycles.

FIG. 9C1 is a flowchart of an example evaluation consistent with step 909 of FIG. 9A.

FIG. 9C2 is a flowchart of example corrective actions consistent with step 911 of FIG. 9A.

FIG. 12A to 12C depict Vth distributions of memory cells in a two-pass programming operation with four data states, consistent with FIG. 9A.

FIG. 14A to 14C depict Vth distributions of memory cells in a two-pass programming operation with eight data states, consistent with FIG. 9A.

FIG. 16A to 16E depict Vth distributions of memory cells in a four-pass programming operation with sixteen data states, consistent with FIG. 9A.

DETAILED DESCRIPTION

Techniques are provided for operating a memory device which detects word line short circuits, such as short circuits between adjacent word lines. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block.

Figure 9D:
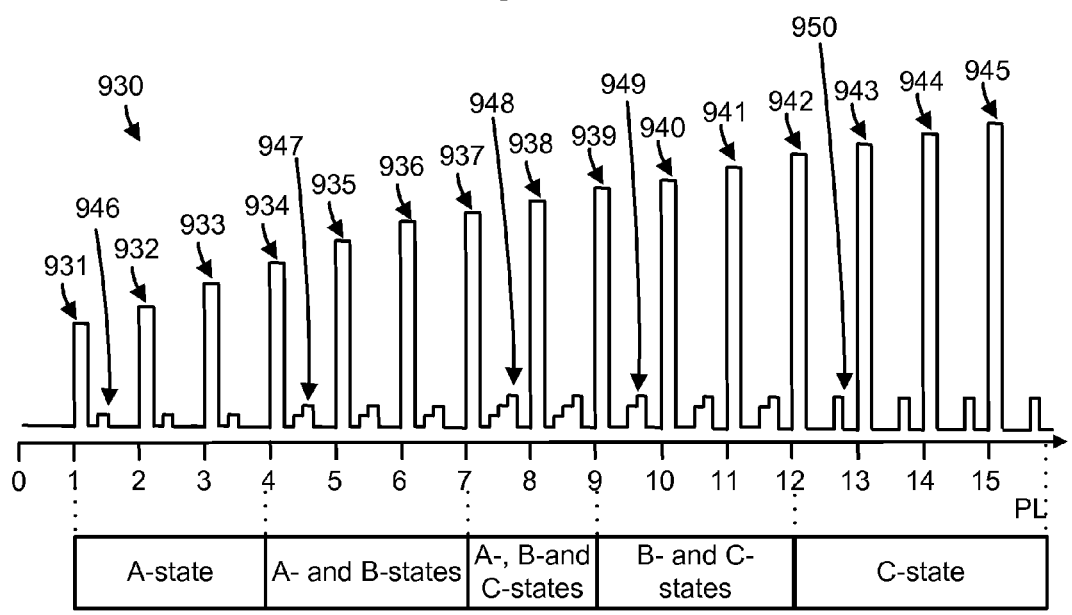
FIG. 9D depicts a waveform of an example programming operation, consistent with FIG. 9A.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9D. Verify operations may be performed after each program voltage to determine whether the memory cells have completed programming. When programming is completed for a memory cell, it can be locked out from further programming while programming continues for other memory cells in subsequent program loops.

In another approach, the programming occurs in a back and forth word line order. In this case, a programming pass may occur for a word line WLn, then for another word line such as WLn+1, then for WLn again and so forth. See examples of the back and forth word line order in FIG. 17A-17C. This approach can reduce capacitive coupling effects which are common in floating gate memory devices, and may be used in general with any type of memory device. In the back and forth word line order, multiple programming passes are used on each word line but the programming passes for a given word line are non-sequential.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states (see FIG. 11B). In a three-bit per cell memory device, there are eight data states including the erased state and seven higher data states referred to as the A, B, C, D, E, F and G data states (see FIG. 13D). In a four-bit per cell memory device, there are sixteen data states including the erased state and fifteen higher data states referred to as the A, B, C, D, E, F, G, H, I, J, K, L, M, N and O data states (see FIG. 15).

However, due to factors such as variations in the fabrication process and stress on the dielectric material between the word lines, electrical short circuit paths may develop between the word lines. Initially, a "soft" short circuit may develop between two adjacent word lines. This type of short circuit typically allows each word line to hold a separate voltage but there is some current leakage from the higher voltage word line to the lower voltage word line. A soft short circuit is, e.g., an electrical leak in a material that is partially conductive of electricity. In practice, word line-to-word line short circuits are a common cause of failures in memory devices, resulting in data corruption on one or more word lines. The short circuit typically is not detected until the word line is read back and it is determined that there are uncorrectable number of errors, so that data loss occurs. With a "hard" short circuit, the two word lines typically cannot hold a separate voltage. A hard short circuit may eventually occur after a soft short circuit. A hard short circuit occurs, e.g., when a fully conductive path is formed in the material between the word lines.

For example, during programming of a word line WLn, a program voltage Vpgm is applied to WLn while a lower pass voltage is applied to other word lines. As Vpgm is stepped up to higher voltages, the dielectric material between the word lines is stressed and there is an increasing likelihood of current leakage to other word lines and, in particular, to WLn+1. This leakage can cause unintentional programming of the memory cells connected to WLn+1 and can result in additional program loops to complete programming on WLn. The additional program loops are required because the programming voltage on WLn, e.g., 15-25 V, is pulled down by the leakage. On the other hand, the pass voltage on WLn+1, e.g., 8-10 V, is pulled up, causing the inadvertent programming. These additional program loops can result in further stress as Vpgm steps up to higher voltages. Or, the programming on WLn may not complete within a maximum allowable number of program loops.

Techniques provided herein address the above and other issues by detecting short circuits earlier in the lifetime of a memory device so that a corrective action can be taken to avoid a loss of data. In an example implementation, during a programming operation, the number of program loops used to complete programming or reach another programming milestone for WLn are counted. If the number of program loops exceeds a loop count limit, the memory cells of WLn+1 are evaluated to determine whether a short circuit is present. The loop count limit may be adjusted lower as the number of PE cycles increases. The evaluation may involve a read operation which determines an extent of the upper tail of the Vth distribution of erased state memory cells of WLn+1 due to inadvertent programming of WLn+1 during programming of WLn. Erased state memory cells are most affected by the short circuit and therefore serve as a good indicator of whether a short circuit is present. If the evaluation indicates a count of the memory cells exceeds a prescribed bit count limit, it is concluded that a short circuit exits between WLn and WLn+1, and a corrective action is taken. If the count does not exceed the prescribed bit count limit, it is concluded that a short circuit does not exist between WLn and WLn+1 and no corrective action is taken. Similarly, no evaluation is needed if the number of program loops does not exceed a loop count limit. As a result, the process checks for a short circuit only when there is an indication that a short circuit may exists, so that processing resources are used efficiently.

Various other features and benefits are described below.

Figure 1A:
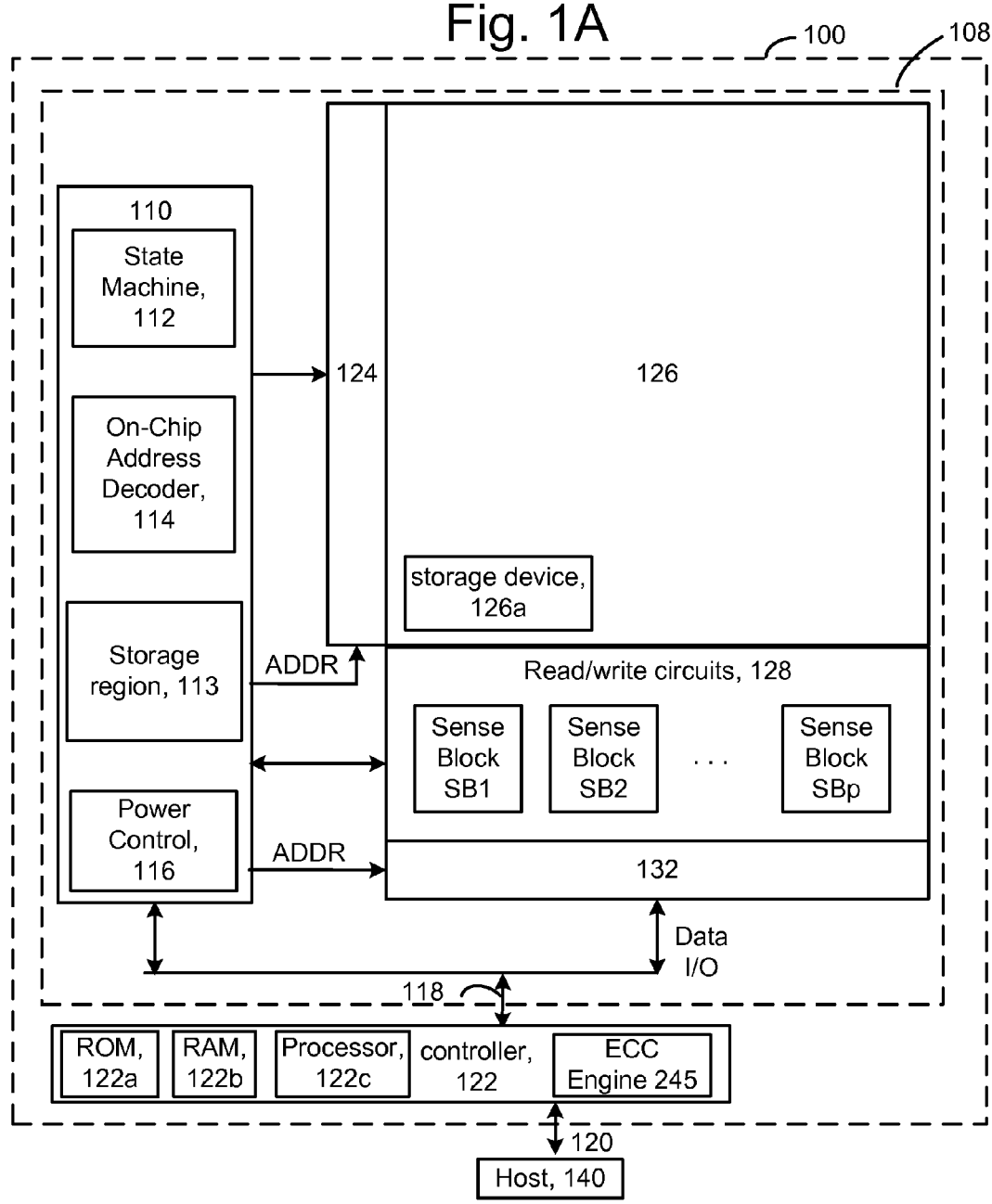
FIG. 1A is a block diagram of an example memory device.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, ..., SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for programming parameters as described herein. For example, the storage region can store data which identifies bad word lines or blocks, and adjustments to loop count limits and bit count limits as a function of program-erase (PE) cycles, for instance as described further below, e.g., in connection with the process of FIG. 9A and in FIGS. 9B1 and 9B2. The number of PE cycles can also be stored.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the flowchart of FIG. 9A. For example, a control circuit may include any one of, or a combination of, control circuitry 110, state machine 112, decoders 114/132, power control module 116, sense blocks SBb, SB2, ..., SBp, read/write circuits 128, controller 122, and so forth. The control circuits can include a programming circuit configured to perform a programming operation for memory cells connected to a selected word line, and a determination circuit which is configured to determine whether memory cells connected to the selected word line reach a programming milestone. These circuit can be part of the at least one control circuit.

Figure 1B:
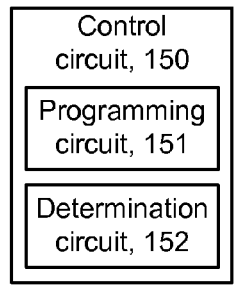
FIG. 1B is a block diagram of an example control circuit 150 which comprises a programming circuit 151 and a determination circuit 152.

For example, FIG. 1B is a block diagram of an example control circuit 150 which comprises a programming circuit 151 and a determination circuit 152. The programming circuit may include software, firmware and/or hardware which implements, e.g., steps 900-907 of FIGS. 9A-9D and FIGS. 11A-17C. The determination circuit may include software, firmware and/or hardware which implements, e.g., decision step 908 of FIG. 9A.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may occur in some cases, such as when there is a soft short circuit. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2 depicts blocks of memory cells in an example two-dimensional configuration of the memory array 126 of FIG. 1A. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
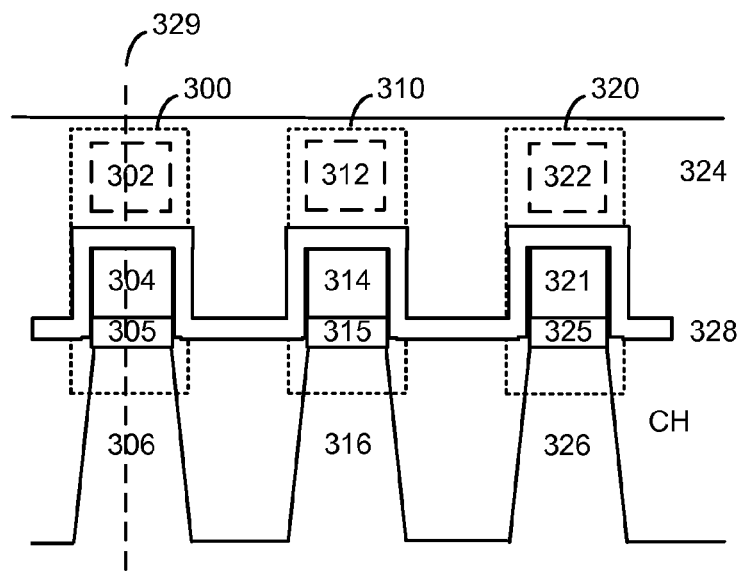
FIG. 3A depicts a cross-sectional view of example floating gate memory cells in NAND strings.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
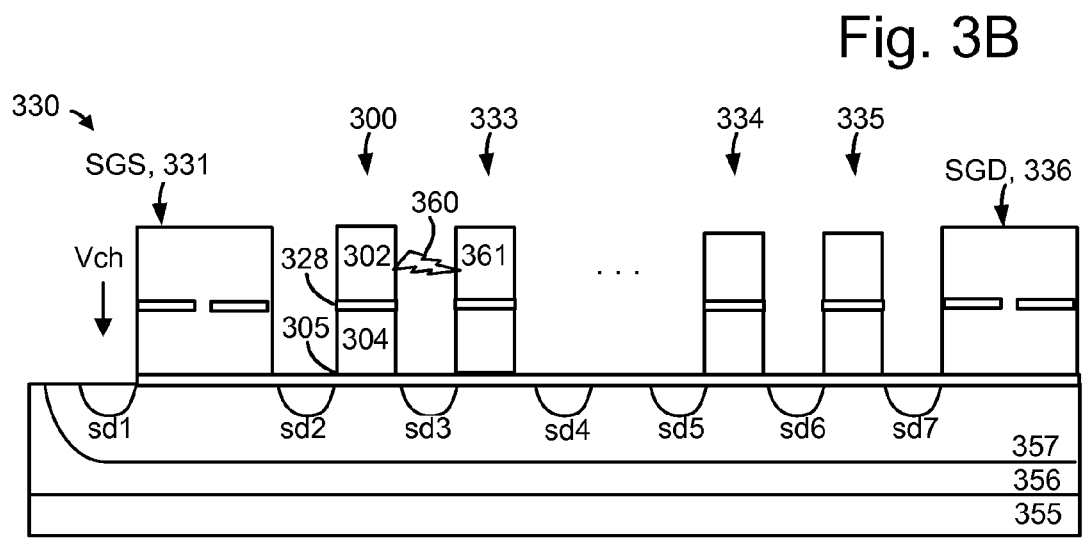
FIG. 3B depicts a cross-sectional view of the structure of FIG. 3A along line 329, including an example short circuit.

FIG. 3B depicts a cross-sectional view of the structure of FIG. 3A along line 329, including an example short circuit. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

An example short circuit 360 is depicted between the word line which includes the control gate 302 and the word line which includes the control gate 361.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1A. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429, including an example short circuit. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

An example short circuit 460 is depicted between the word line which includes the control gate 402 and the word line which includes the control gate 461.

Figure 5:
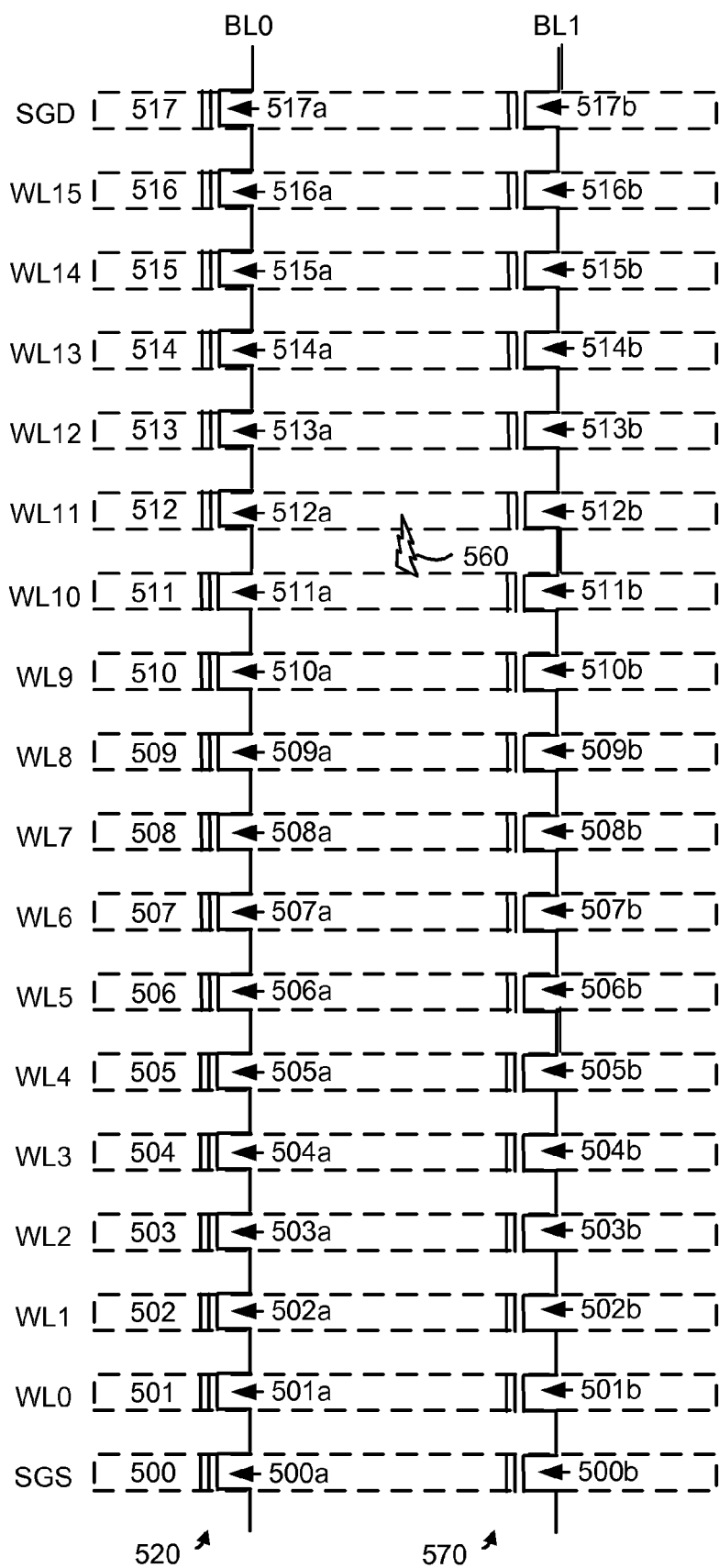
FIG. 5 depicts the block 200 of FIG. 2, showing the word lines and including an example short circuit.

FIG. 5 depicts the block 200 of FIG. 2, showing the word lines and including an example short circuit. Example NAND strings 520 and 570 are depicted. Control gate lines include word lines and select gate lines. The control gate lines are, in order from the source side of the block to the drain side of the block: SGS line 500, WL0 501, WL1 502, WL2 503, WL3 504, WL4 505, WL5 506, WL6 507, WL7 508, WL8 509, WL9 510, WL10 511, WL11 512, WL12 513, WL13 514, WL14 515, WL15 516 and SGD line 517.

The SGS lines 500 and 517 are connected to select gate transistors 500a and 517a, respectively, in NAND string 520. The word lines WL0 501, WL1 502, WL2 503, WL3 504, WL4 505, WL5 506, WL6 507, WL7 508, WL8 509, WL9 510, WL10 511, WL11 512, WL12 513, WL13 514, WL14 515 and WL15 516 are connected to memory cells 501a, 502a, 503a, 504a, 505a, 506a, 507a, 508a, 509a, 510a, 511a, 512a, 513a, 514a, 515a and 516a, respectively, in NAND string 520.

Similarly, the SGS lines 500 and 517 are connected to select gate transistors 500b and 517b, respectively, in NAND string 570. The word lines WL0 501, WL1 502, WL2 503, WL3 504, WL4 505, WL5 506, WL6 507, WL7 508, WL8 509, WL9 510, WL10 511, WL11 512, WL12 513, WL13 514, WL14 515 and WL15 516 are connected to memory cells 501b, 502b, 503b, 504b, 505b, 506b, 507b, 508b, 509b, 510b, 511b, 512b, 513b, 514b, 515b and 516b, respectively, in NAND string 520.

An example short circuit 560 is depicted between the WL10 511 and WL11 512. WL0-WL10 may be programmed before the short circuit is detected by evaluating WL11 in response to an unusually high program loop count on WL10.

Figure 6A:
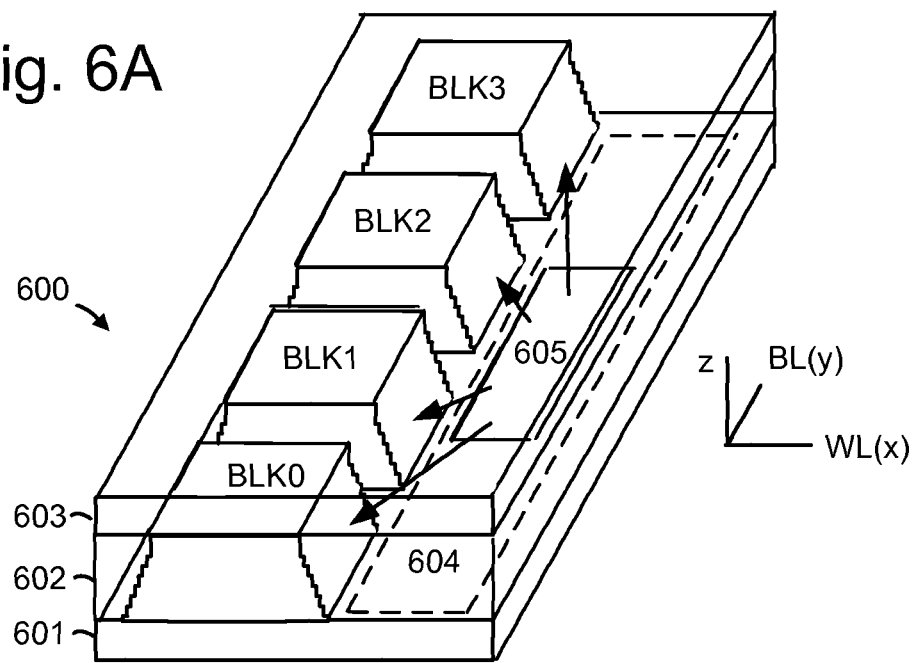
FIG. 6A is a perspective view of a memory device 600 comprising a set of blocks in an example three-dimensional configuration of the memory array 126 of FIG. 1A.

FIG. 6A is a perspective view of a memory device 600 comprising a set of blocks in an example three-dimensional configuration of the memory array 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
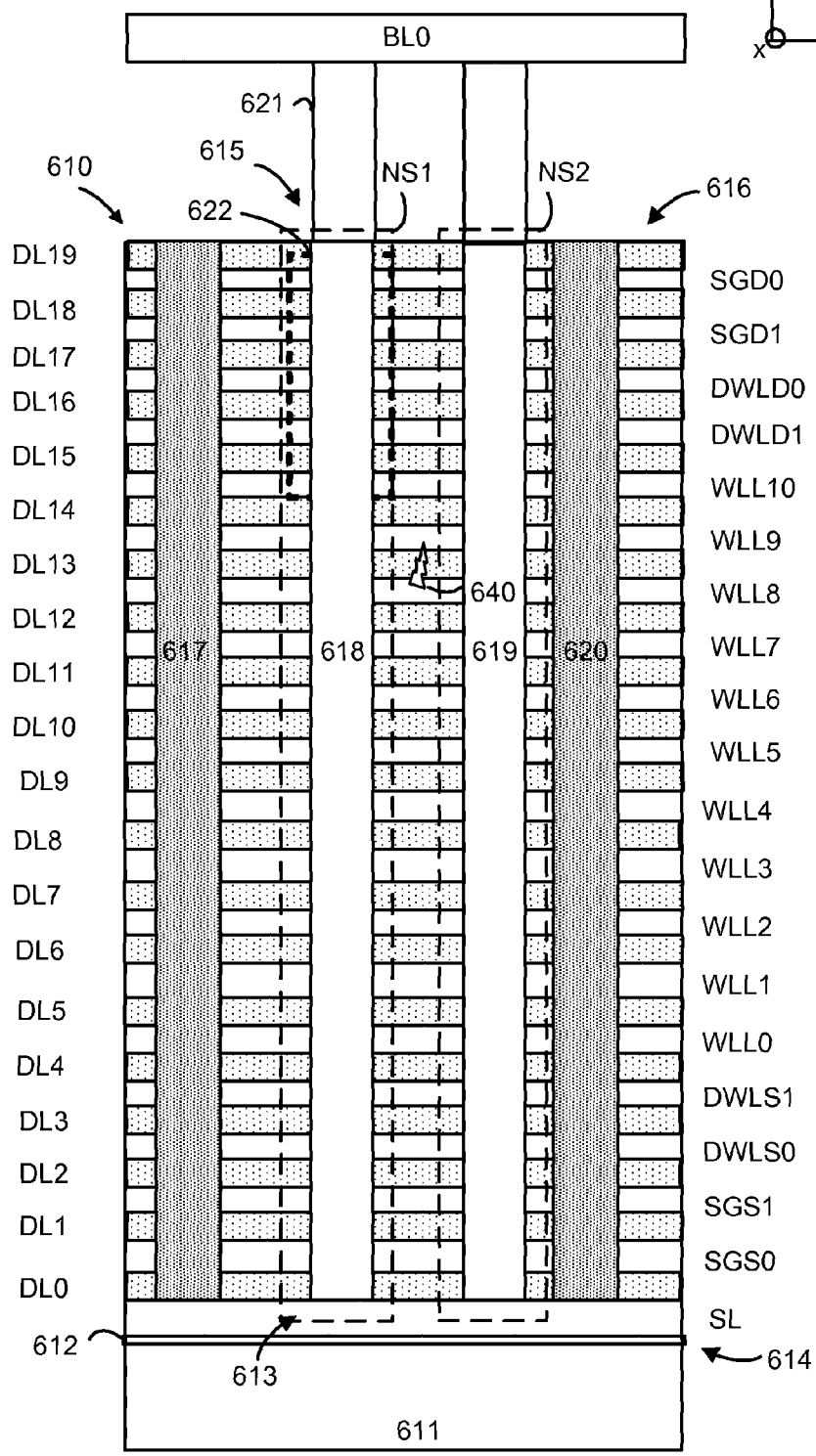
FIG. 6B depicts an example cross-sectional view of a portion of one of the blocks of FIG. 6A, including an example short circuit.

FIG. 6B depicts an example cross-sectional view of a portion of one of the blocks of FIG. 6A, including an example short circuit. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

An example short circuit 640 is depicted in DL13, between WLL8 and WLL9. WL0-WL8 may be programmed before the short circuit is detected by evaluating WL9 in response to an unusually high program loop count on WL8.

Figure 6C:
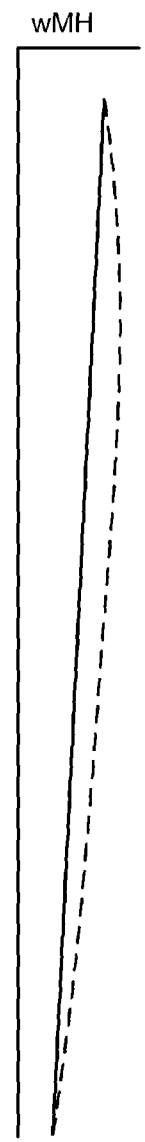
FIG. 6C depicts a plot of memory hole diameter in the stack of FIG. 6B.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole (solid line in FIG. 6C). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (dashed line in FIG. 6C). For example, the memory hole width is a maximum at the level of WL9 in the stack, in this example. The memory hole width is slightly smaller at the level of WL10, and progressively smaller at the levels of WL8 to WL0.

Due to the non-uniformity in the width of the memory hole, the programming and erase speed of the memory cells can vary based on their position along the memory hole, e.g., based on their height in the stack. With a smaller diameter memory hole, the electric field across the tunnel oxide is relatively stronger, so that the programming and erase speed is relatively higher.

Figure 6D:
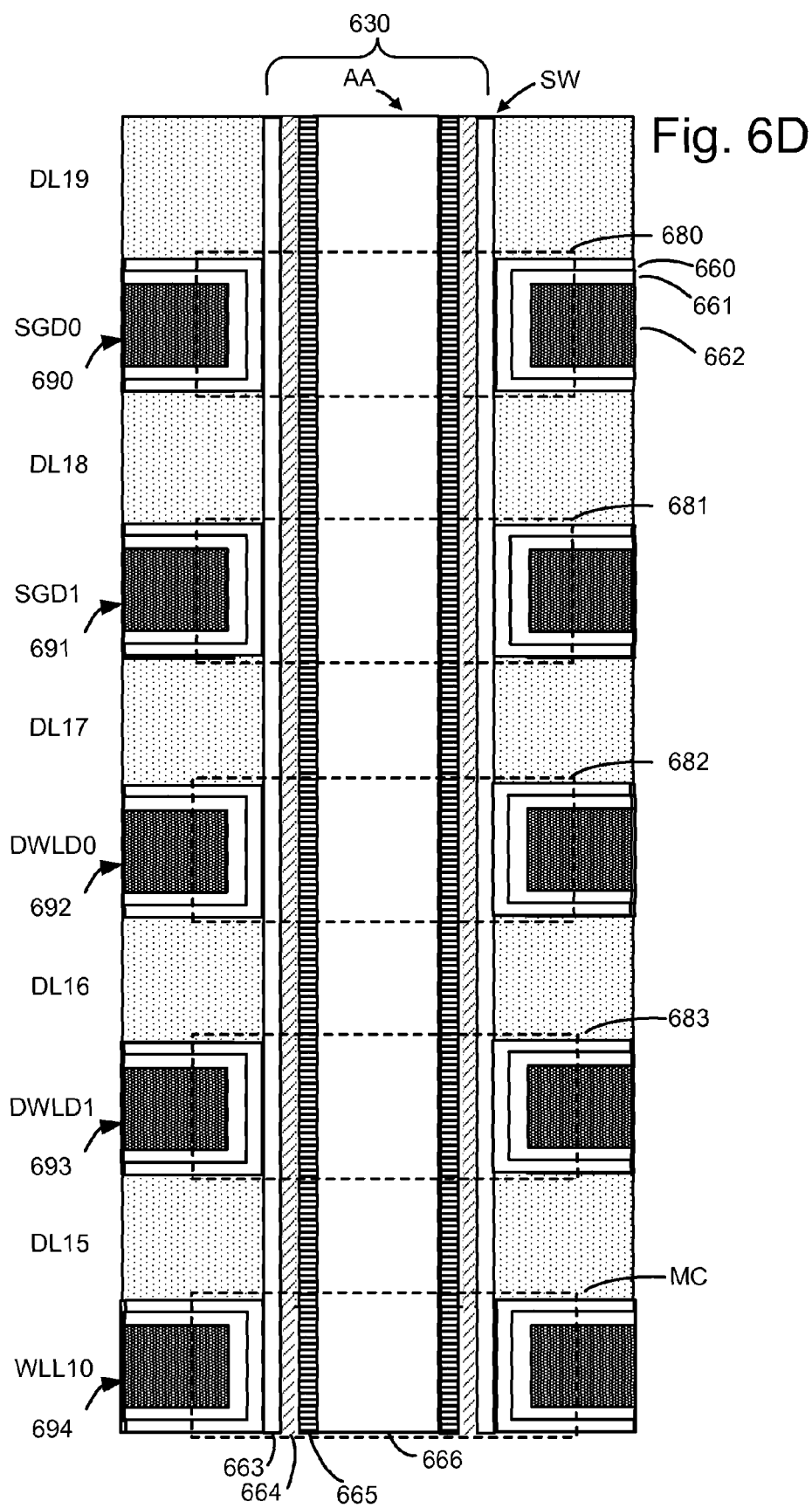
FIG. 6D depicts a close-up view of the region 622 of the stack of FIG. 6B.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
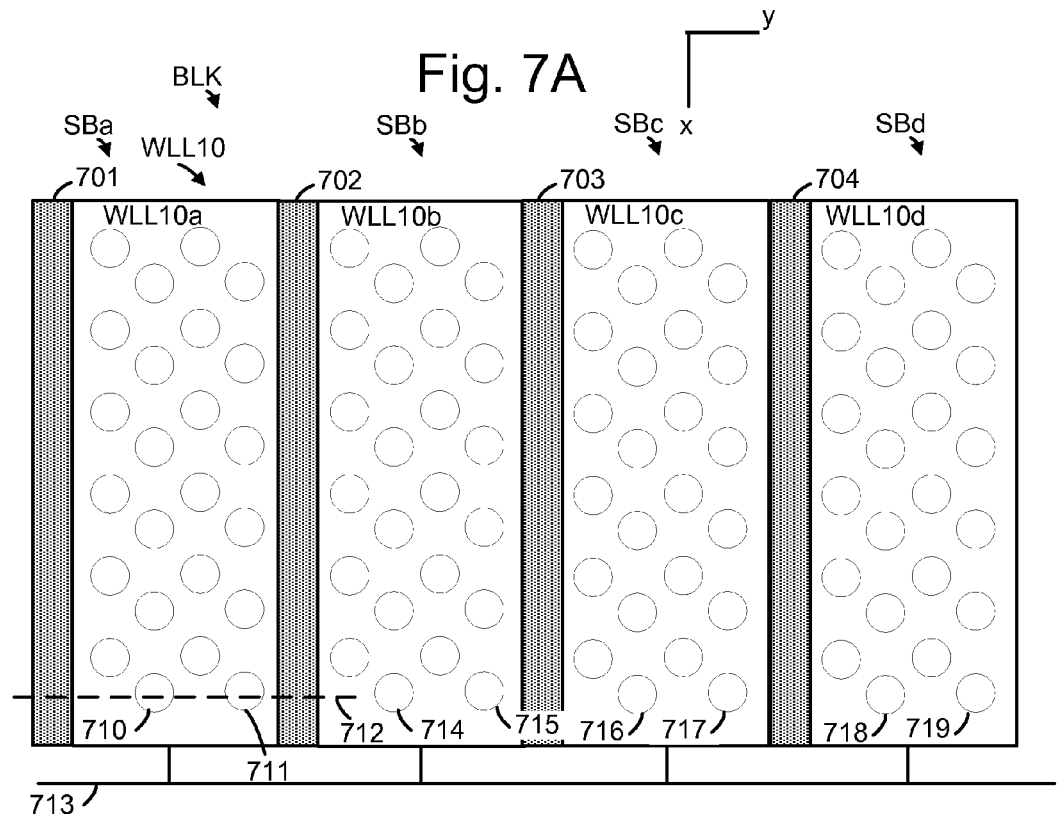
FIG. 7A depicts a top view of an example word line layer WLL10 of the stack of FIG. 6B.

FIG. 7A depicts a top view of an example word line layer WLL10 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. Further, a word line layer in a block can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions WLL10a, WLL10b, WLL10c and WLL10d which are each connected by a connector 713. The last region of a word line layer in a block can be connected to a first region of a word line layer in a next block, in one approach. The connector, in turn, is connected to a voltage driver for the word line layer. The region WLL10a has example memory holes 710 and 711 along a line 712. See also FIGS. 7B and 8A. The region WLL10b has example memory holes 714 and 715. The region WLL10c has example memory holes 716 and 717. The region WLL10d has example memory holes 718 and 719. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Each circle can alternatively represent a memory cell which is provided by the materials in the memory hole and by the adjacent word line layer.

Metal-filled slits 701, 702, 703 and 704 (e.g., metal interconnects) may be located between and adjacent to the edges of the regions WLL10a-WLL10d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8 for further details of the sub-blocks SBa-SBd of FIG. 7A.

Figure 7B:
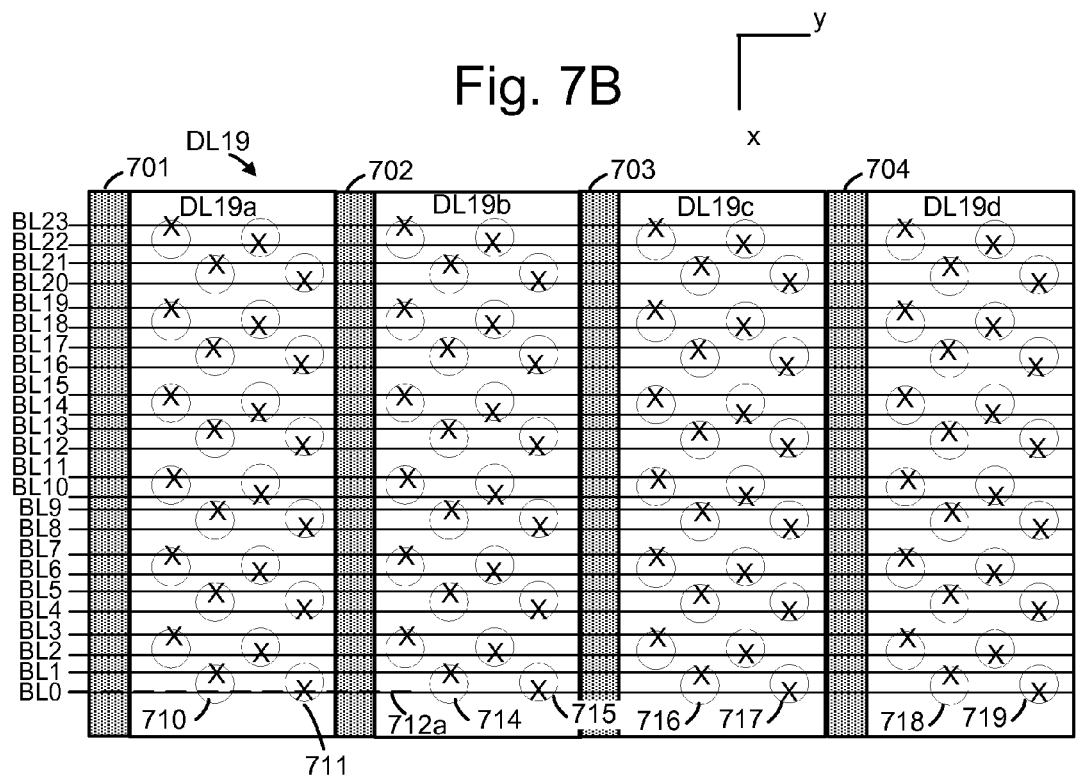
FIG. 7B depicts a top view of an example top dielectric layer DL19 of the stack of FIG. 6B.

FIG. 7B depicts a top view of an example top dielectric layer DL19 of the stack of FIG. 6B. The dielectric layer is divided into regions DL19a, DL19b, DL19c and DL19d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the -x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

FIG. 8 depicts example NAND strings in the sub-blocks SBa-SBd of FIG. 7A, including an example short circuit. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

An example short circuit 640a is depicted between WLL8 and WLL9. WL0-WL8 may be programmed before the short circuit is detected by evaluating WL9 in response to an unusually high program loop count on WL8. Memory cells on WL8 include memory cells 812, 832, 852 and 872. Memory cells on WL9 include memory cells 813, 833, 853 and 873. In this example, the programming of the block may occur sub-block by sub-block. For example, SBa may be programmed from WLL0-WLL10, then SBb may be programmed from WLL0-WLL10, then SBc may be programmed from WLL0-WLL10 and then SBd may be programmed from WLL0-WLL10. The evaluation which detects a short circuit can occur during programming of any of these sub-blocks.

FIG. 9A is a flowchart of an example programming operation in a memory device which checks for a short circuit between word lines. Step 900 involves beginning a programming operation for a set of word lines. In some cases, a programming operation will include data for each of the word lines in a block or sub-block. In other cases, a programming operation will include data for fewer than all word lines in a block or sub-block, so that the last word line used to store data is before the last drain-side word line. A subsequent programming operation can then continue to fill the memory cells of the next word line, after the last word line used in the previous programming operation. The detection of a short circuit can occur in any of these example scenarios.

Step 901 includes selecting a word line to program, setting an initial value of the program voltage, and setting a loop count=1 to denote the first program loop. Step 902 includes applying the program voltage (Vpgm) to the word line. Step 903 includes performing a verify operation. A decision step 904 determines whether programming of the word line is done. Programming may be done when all, or nearly all, of the cells reach an intended verify voltage. If the programming is done, a decision step 908 determines whether a programming milestone is met. One example is whether the loop count exceeds a loop count limit, where this loop count limit is optionally adjusted based on PE cycles. See FIG. 9B1. For example, the program loop count at the completion of the programming operation may be a number such as 28 loops, while the loop count limit is a number such as 25 loops. The presence of the three extra program loops indicates a soft short circuit may exist. As an alternative, decision step 908 could involve reading back the cells on WLn and counting a number of errors using the ECC decoding process, in which case decision step 908 is true if the number of errors does not exceed a prescribed threshold such as the maximum number of correctable errors.

The program loop count can be, e.g., for a single programming pass in which one or more pages of data are programmed. For example, in full sequence programming, multiple pages of data may be programmed in one pass. In multi-pass programming, a single page of data may be programmed in each pass, although it is also possible to program multiple pages in one pass. The program loop count can therefore be for a single page among the multiple pages. The program loop count can be the same or different for each page among the multiple pages. That is, the program loop count can be the same or different for each pass among the multiple passes. For example, in multi-pass programming with three bits per cell, a lower page may be programmed and have an associated first loop count limit in a first programming pass, a middle page may be programmed and have an associated second loop count limit in a second programming pass, and an upper page may be programmed and have an associated third loop count limit in a third programming pass.

Further, when multiple pages are to be programmed on WLn in multiple passes, one option is to halt the programming on WLn when a loop count limit is exceeded for a particular pass, and to continue with the remaining one or more passes only if the evaluation of WLn+1 does not indicate a short circuit. Another option is to complete all programming passes and compare the loop counts to a respective loop count limit for each pass. A decision of whether to perform the evaluation of WLn+1 can be based on the comparison for each pass. For example, the decision can be based on the number of passes in which the loop count limit is exceeded and the amount by which the loop count limit is exceeded. The evaluation may be performed if the loop count limit is exceeded in x out of y passes, where y is an integer of two or more and x is an integer of one or more. The evaluation may be performed if the loop count limit is exceeded by more than z loops in one or more program passes, where z is an integer of one or more.

In an example implementation, the loop count for a first programming pass for a lower page on WLn does not exceed a loop count limit, but the loop count for a second programming pass for an upper page on WLn does exceed a loop count limit. In this case, WLn+1 is evaluated in response to the loop count limit being exceeded on the second pass.

The loop count limit or limits may be stored in a storage location of the memory device such as the storage region 113. The loop count limit may be stored in the die or provided in a lookup table, for instance.

If decision step 908 is true, step 909 evaluates WLn+1 for a WL to WL short circuit. See FIG. 9C1. Generally, step 908 being true indicates the programming of the word line proceeded at a slower than expected pace, so that more program loops were needed than expected. The completion of the programming of the word line in no more than the maximum allowable number of program loops at decision step 904 is an example of reaching a programming milestone for the word line.

Based on the evaluation, a control circuit make a conclusion of whether the soft short circuit exists, and if the conclusion is that the soft short circuit exists, takes a corrective action.

If decision step 910 determines that there is a short circuit, step 911 takes a corrective action. See FIG. 9C2. If decision step 908 or 910 is false, no corrective action is taken at step 912 and decision step 906 is reached. Decision step 906 determines whether there is a next word line to program, e.g., in a block or sub-block. If decision step 906 is true, step 901 is reached and another word line is selected. If decision step 906 is false, the programming operation ends at step 907.

If decision step 904 is false, a decision step 905 determines whether the loop count has reached a maximum allowable count, e.g., 30-40 loops. If decision step 905 is true, the corrective action of step 911 is reached. In this case, the data has not been successfully programmed on WLn so WLn may be marked as being bad to prevent future programming of the word line. Step 909 can optionally be performed as well in this situation. If decision step 905 is false, decision step 906 steps up Vpgm and increments the loop count. Subsequently, step 902 is reached to start the next program loop.

Step 903 includes an option to reach decision step 908 before the programming of the word line is done. In this case, a determination can be made that the programming of the word line is proceeding at a slower than expected pace partway through the programming operation, before the completion of the programming operation. This can be helpful in that the evaluation of step 909 is performed before Vpgm become higher, stressing the inter-word line material and possibly encouraging the development of a short circuit. Also, time is saved since the remainder of the programming of WLn does not have to be completed if a short circuit is detected.

Another example programming milestone may involve determining the program loop in which at least a specified number of memory cells have completed programming to one data state of a plurality of different data states. For example, how many program loops are needed to cause at least 50% of the A-data state cells to pass their verify test at VvA? In this example, the determination that at least 50% of the A-data state cells pass their verify test triggers the branch to decision step 908 from step 903. For example, five loops may be needed whereas the programming milestone is four loops. In this case, the programming milestone is not met.

A programming milestone could involve more than one condition as well. For example, the programming milestone may involve a condition partway through the programming operation and a condition at the completion of the programming operation. For example, the programming milestone may require that at least 50% of the A-data state cells pass their verify test within four program loops and that no more than 25 loops are used to complete the programming. The branch to decision step 908 from step 903 may be triggered if both conditions are not met.

The programming milestone may be tailored to a current programming pass when a multi-pass programming operation is performed.

In another option, the detection of short circuits may occur in a test mode in which the memory device is subject to a stress test by programming the memory cells to the highest data state. This can result in a higher chance of a soft or marginal short circuit. For instance, a single long programming pulse may be used. In this case, a programming pass comprises a stress test in which the memory cells of the selected word line are programmed to a highest available state.

FIG. 9B1 is a plot of a change in a loop count limit (solid line) as a function of a number of PE cycles. As PE cycles increase, a memory device generally becomes easier to program so that a program operation can be completed in fewer program loops. As a result, the loop count limit which is used to determine whether the programming of a word line occurs at a slower than expected pace may be adjusted based on the PE count. A control circuit is configured to adjust the loop count limit to be inversely proportional to a number of PE cycles in the block or sub-block. The dashed line represents the expected number of program loops in the absence of a short circuit. This expected number can be determined from testing of the memory device, taking an average or median over different word lines, blocks or sub-blocks, for instance. The difference (d) between the two plots can also be defined in the memory device. In one approach, the difference is fixed as PE cycles increase. In another approach, the difference changes as PE cycles increase. For instance, it may be found that there is a wider variation in the expected loop count as PE cycles increase. In this case, the difference may increase as PE cycles increase so that the loop count is not exceeded too frequently. The user/host device may have the ability to set the difference according to the degree of reliability which is required. The difference may be inversely proportional to the degree of reliability which is required.

FIG. 9B2 is a plot of a change in a read voltage Vrsc as a function of a number of PE cycles. As PE cycles increase, the upshift in Vth on WLn+1 may increase due to degradation of the memory device. To accommodate this natural increase which is not due to a short circuit, Vrsc can increase in proportion to the PE count. Vr1 can also increase similarly. Vrsc and Vr1 are discussed further below. A control circuit is configured to adjust the read voltage to be proportional to a number of PE cycles in the block or sub-block.

Another approach is to increase the bit count limit with PE cycles. A control circuit is configured to adjust the bit count limit to be proportional to a number of PE cycles in the block or sub-block. In this case, Vrsc may be fixed or vary with PE cycles.

Optionally, the process to detect short circuits can be turned on or off based on the number of PE cycles. For example, the process can be turned on periodically to reduce any performance impact.

FIG. 9C1 is a flowchart of an example evaluation consistent with step 909 of FIG. 9A. As mentioned, step 909 evaluates WLn+1 for a WL to WL short circuit. In one approach, at step 915, it is known based on the word line programming order that all memory cells on WLn+1 are in the erased state. This may occur where the word lines are fully programmed one at a time, such as in FIG. 17A. Step 916 reads the memory cells of WLn+1 using a read voltage Vrsc. See FIGS. 10 and 12B. Step 917 counts the number of memory cells with Vth>Vrsc. Step 918 compares the count to a bit count limit, where a bit is term which refers to a memory cell. This bit count limit can be customized for the memory device, or even for an individual word line. The bit count limit can also be adjusted, e.g., increased as PE cycles increase. Generally, Vrsc>=VvEr, so that the read operation detects memory cells with a Vth which has increased due to inadvertent programming from the soft short circuit. In one example, Vrsc is 0 V or more. The optimal read voltage and bit count limit can be determined and characterized for a given memory device, block, sub-block or word line.

In another approach, at step 919, it is known based on the word line programming order that some memory cells on WLn+1 are in the erased state and others are in a higher state. This may occur where the word lines are programmed in a back and forth word line order, such as in FIGS. 17B and 17C. Step 920 reads the memory cells of WLn+1 using read voltages Vrsc and Vr1, where Vr1>Vrsc. See FIG. 13B. Step 921 counts the number of memory cells with Vr1>Vth>Vrsc. These are the erased state memory cells with an upshift in Vth due to the short circuit. Step 918 compares the count to a bit count limit, as discussed. The read at Vr1 allows the erase state memory cells to be identified.

FIG. 9C2 is a flowchart of example corrective actions consistent with step 911 of FIG. 9A. As mentioned, step 911 takes a corrective action when a short circuit is detected. In one approach, step 922 marks WLn and WLn+1 as being bad to prevent future programming of these word lines, and continues use of other word lines in the block or sub-block. These other word lines include the previously programmed word lines WL0 to WLn−1 and the later programmed word lines, WLn+2 to the last drain side word line. For example, the data on the previously programmed word lines can remain in place, and later programmed word lines can be used for subsequent programming. It is also possible that short circuits are detected for two or more pairs of adjacent word lines. This approach advantageously allows a remainder of the word lines to continue to be used and avoids the performance impact of a plane or full die recovery.

Step 923 involves recovering data from WLn and storing the data in another word line, e.g., in the same block or sub-block as WLn or in a different block or sub-block. Assuming data has been successfully programmed into the memory cells of WLn, the data should be recoverable by a read operation. In some cases, one or more pages of data were successfully programmed into the memory cells of WLn before the short circuit is detected, such that one or more remaining pages of data were not yet successfully programmed into the memory cells of WLn. In this case, the recovery operation can read back the one or more pages of data were successfully programmed in WLn.

In another approach, step 924 marks WLn and WLn+1 as being bad and step 925 recovers data from the block or sub-block and stores it in another block or sub-block. In this case, the entire block is deemed bad due to the short circuit and is no longer used.

FIG. 9D depicts a waveform of an example programming operation, consistent with FIG. 9A. The horizontal axis depicts a program loop number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages.

For each program voltage, a square waveform is depicted for simplicity, although other shapes are possible such as a multilevel shape or a ramped shape. Further, Incremental Step Pulse Programming (ISPP) is used in this example, in which the program voltage steps up in each successive program loop. This example uses ISPP in a single programming pass in which the programming is completed. ISPP can also be used in each programming pass of a multi-pass operation.

A pulse train typically includes program voltages which increase stepwise in amplitude in each program-verify iteration using a fixed or varying step size. A new pulse train can be applied in each programming pass of a multi-pass programming operation, starting at an initial Vpgm level and ending at a final Vpgm level which does not exceed a maximum allowed level. The initial Vpgm levels can be the same or different in different programming passes. The final Vpgm levels can also be the same or different in different programming passes. The step size can be the same or different in the different programming passes. In some cases, a smaller step size is used in a final programming pass to reduce Vth distribution widths.

The pulse train 930 includes a series of program voltages 931, 932, 933, 934, 935, 936, 937, 938, 939, 940, 941, 942, 943, 944 and 945 that are applied to a word line selected for programming, and an associated set of non-volatile memory cells. One, two or three verify voltages are provided after each program voltage as an example, based on the target data states which are being verified. 0 V may be applied to the selected word line between the program and verify voltages. For example, an A-state verify voltage of VvA (e.g., waveform 946) may be applied after each of the first, second and third program voltages 931, 932 and 933, respectively. A- and B-state verify voltages of VvA and VvB (e.g., waveform 947) may be applied after each of the fourth, fifth and sixth program voltages 934, 935 and 936, respectively. A-, B- and C-state verify voltages of VvA, VvB and VvC (e.g., waveform 948) may be applied after each of the seventh and eighth program voltages 937 and 938, respectively. B- and C-state verify voltages of VvB and VvC (e.g., waveform 949) may be applied after each of the ninth, tenth and eleventh program voltages 939, 940 and 941, respectively. Finally, a C-state verify voltage of VvC (e.g., waveform 950) may be applied after each of the twelfth, thirteenth, fourteenth and fifteenth program voltages 942, 943, 944 and 945, respectively.

Figure 10:
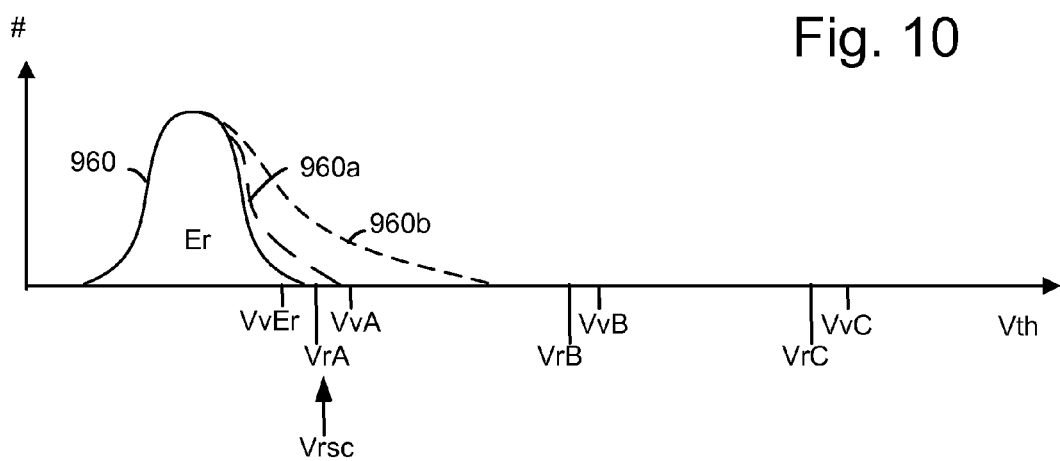
FIG. 10 depicts a threshold voltage (Vth) distribution of memory cells in an erased state distribution, where the upper tail of the Vth distribution is extended due to a short circuit with an adjacent word line, in an evaluation which is consistent with step 909 of FIG. 9A.

FIG. 10 depicts a Vth distribution of memory cells in an erased state distribution, where the upper tail of the Vth distribution is extended due to a short circuit with an adjacent word line, in an evaluation which is consistent with step 909 of FIG. 9A. Typically, the cells are initially erased to a Vth distribution 960 using an erase-verify voltage VvEr. A small number of erased state cells may have a Vth which is above VvEr due to a bit ignore criteria. The Vth distribution 960a may be seen when the erased state memory cells are subject to some type of disturbance, such as coupling from neighbor word lines. There is a relatively small upshift in Vth. For example, the upper tail of the Vth distribution may be below VrA, the read voltage which distinguished Er state cells from A state cells. In this case, there will be few or no read errors when reading back the Er state cells. One the other hand, the Vth distribution 960b may be seen when the erased state memory cells are subject to inadvertent programming due to a short circuit. There is a relatively large in Vth. For example, the upper tail of the Vth distribution may be above VrA or even above VvA, the A state verify voltage. In this case, there will be uncorrectable errors when reading back the Er state cells.

The read voltage, Vrsc, discussed previously can be greater than VvEr to detect an extent of the upper tail of the Vth distribution, e.g., the extent of the Vth upshift. The extent of the upshift is proportional to the count of cells for which Vth>Vrsc. In one example, Vrsc>=VrA, the read voltage which distinguishes the erased state from the next higher state (e.g., the A state). In another example, Vrsc>=VvA, the verify voltage of the next higher state (e.g., the A state).

In this example, there are four possible data states, e.g., the erased (Er) which stores bits 11, the A state which stores bits 01, the B state which stores bits 00 and the C state which stores bits 10.

The A, B and C state cells can be programmed in one or more passes from the erased state to their final Vth distribution using the verify voltages of VvA, VvB and VvC. Additionally, read voltages VrA, VrB and VrC are used to read the data state of a cell by distinguishing between adjacent data states.

In another possible approach, the memory cells can be programmed to a single state such as the A state.

Figure 11A:
FIGS. 11A and 11B depict Vth distributions of memory cells in an example one-pass programming operation with four data states, consistent with FIG. 9A.
Figure 11B:
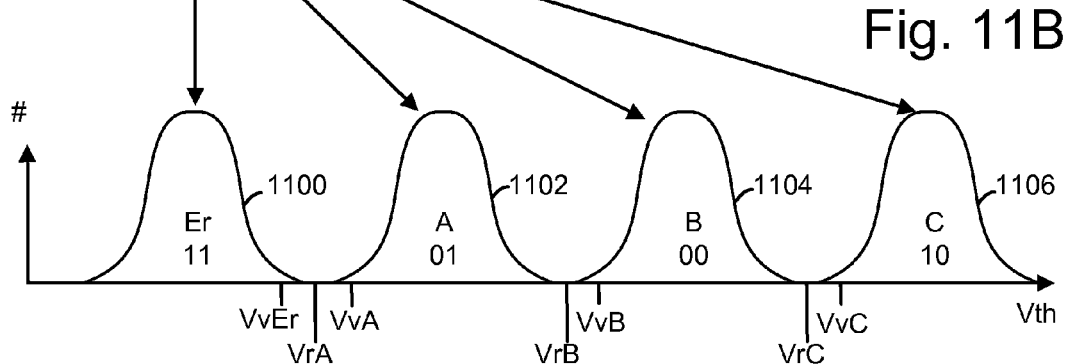

FIGS. 11A and 11B depict Vth distributions of memory cells in an example one-pass programming operation with four data states, consistent with FIG. 9A. In this example, the memory cells are initially in the erased state (bits 11) as represented by the Vth distribution 1100. Subsequently, the programming causes the Vth of the A, B and C state cells to reach the Vth distributions 1102, 1104 and 1106, respectively. A small number of A, B and C state cells may have a Vth which is below VvA, VvB or VvC, respectively, due to a bit ignore criteria.

Figure 11C:
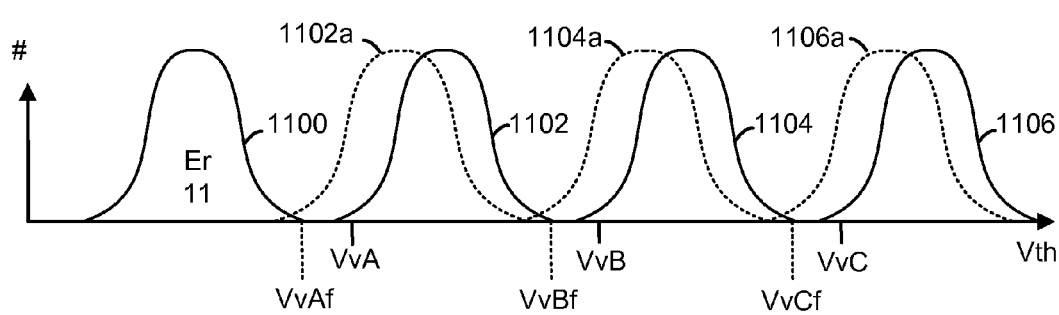
FIG. 11C depicts Vth distributions of memory cells after a first pass (a foggy pass) and a second pass (a fine pass) of an example two-pass programming operation with four data states, consistent with FIG. 9A.

FIG. 11C depicts Vth distributions of memory cells after a first pass (a foggy pass) and a second pass (a fine pass) of an example two-pass programming operation with four data states, consistent with FIG. 9A. In this example, the first programming pass causes the Vth of the A, B and C state cells to reach the Vth distributions 1102a, 1104a and 1106a, respectively, using verify voltages of VvAf, VvBf and VvCf, respectively. This first pass can be a rough programming which uses a relatively large step size, for instance, so that the Vth distributions 1102a, 1104a and 1106a are relatively wide. The second pass may use a smaller step size and causes the Vth distributions 1102a, 1104a and 1106a to transition to the final Vth distributions 1102, 1104 and 1106, respectively, which are relatively narrow. This two-pass programming operation can achieve relatively narrow Vth distributions.

Figure 11D:
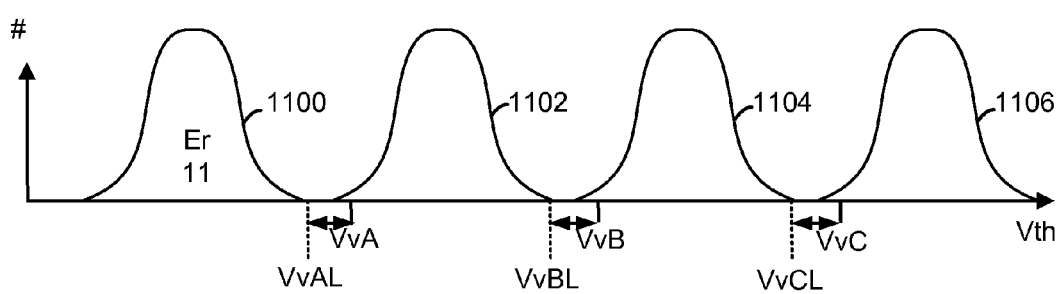
FIG. 11D depicts Vth distributions of memory cells in a one-pass programming operation which uses a slowdown measure.

FIG. 11D depicts Vth distributions of memory cells in a one-pass programming operation which uses a slowdown measure. During a programming operation, when the Vth of a cell is close to the final verify voltage, the programming speed of the cell can be slowed down. For example, when the Vth of an A, B or C state cell exceeds VvAL, VvBL or VvCL, respectively, the programming speed can be slowed by raising an associated bit line voltage to an intermediate level, between 0 V and a lockout level, during the subsequent programming voltages. Once the A, B or C state cell exceeds the final verify voltage of VvA, VvB or VvC, respectively, the cell can be locked out from further programming by raising the associated bit line voltage to a lockout voltage during subsequent programming voltages. The zones between VvAL and VvA, VvBL and VvB, and VvCL and VvC, depicted by horizontal arrows, represent zones in which the slow programming is used for the A, B and C state cells, respectively.

FIG. 12A to 12C depict Vth distributions of memory cells in a two-pass programming operation with four data states, consistent with FIG. 9A. Each pass can be used to program a page of data. For example, programming of lower and upper pages in two-bit, four-level memory cells is provided. Programming can be performed one logical page at a time, with the lower page followed by the upper page. Initially, all memory cells are in the erased (Er) state, represented by the Vth distribution 1200.

FIG. 12B depicts programming of a lower page of data. If the lower page has a bit=1, the associated memory cell remains in the Vth distribution 1200 and the data is represented by x1, where x is an upper page bit that is not yet known. If the lower page has a bit=0, the memory cell is programmed to a higher Vth as represented by distribution 1202, which is an interim distribution (INT), using a verify voltage VvINT. The data of these memory cells is represented by x0. Note that the interim distribution can be relatively wide since it is not a final distribution and does not represent a final data state. The Vth distribution 1200a represents the case where a short circuit exists such that there is a significant upshift in the upper tail of the Vth distribution.

Figure 17A:
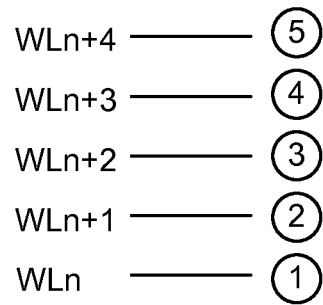
FIG. 17A depicts an example word line programming order in which (1) WLn is fully programmed before (2) programming a next word line WLn+1.
Figure 17B:
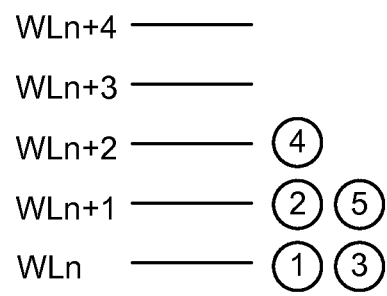
FIG. 17B depicts an example word line programming order in which (1) WLn is programmed a first time, (2) WLn+1 is programmed a first time, (3) WLn is programmed a second and final time, (4) WLn+2 is programmed a first time, (5) WLn+1 is programmed a second and final time, and so forth.
Figure 17C:
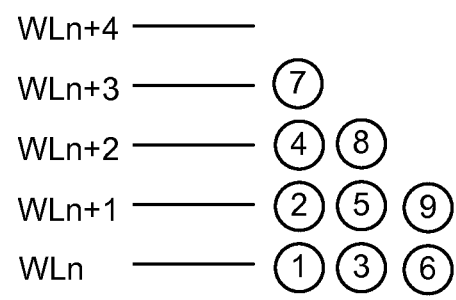
FIG. 17C depicts an example word line programming order in which (1) WLn is programmed a first time, (2) WLn+1 is programmed a first time, (3) WLn is programmed a second time, (4) WLn+2 is programmed a first time, (5) WLn+1 is programmed a second time, (6) WLn is programmed a third and final time, (7) WLn+3 is programmed a first time, (8) WLn+2 is programmed a second time, (9) WLn+1 is programmed a third and final time, and so forth.

In this example, assume the word line programming order of FIG. 17C is used such that WLn+1 has the Vth distribution of FIG. 12B while WLn has the Vth distribution of FIG. 12C when a short circuit is detected. In this case, if the read operation detected memory cells for which Vth>Vrsc, this would include the INT state cells as well as the upshifted Er state cells. This would make it harder to identify the extent of the Vth upshift for the Er state cells. To resolve this, an additional read can be made at Vr1, where Vr1<VvINT. That is, Vr1 is less than the verify voltage of the state above the erased state. The read using Vr1 identifies the erased state cells as those cells with Vth<Vr1. Among these cells, the read using Vrsc identifies the extent of the upshift of the Er state cells.

FIG. 12C depicts programming of an upper page of data. If UP/LP=11, the associated memory cell in the Vth distribution 1200 remains in the Vth distribution 1200 and stores data bits 11. If UP/LP=01, the memory cells in the Vth distribution 1200 are programmed to the Vth distribution 1204. If UP/LP=10, the memory cells in the Vth distribution 1202 are programmed to the Vth distribution 1208. If UP/LP=00, the memory cells in the Vth distribution 1202 are programmed to the Vth distribution 1206. The example read levels and program-verify voltages discussed previously are also depicted. Programming can be similarly extended to three or more bits per memory cell.

Figures 13A, 13B, 13C, 13D:
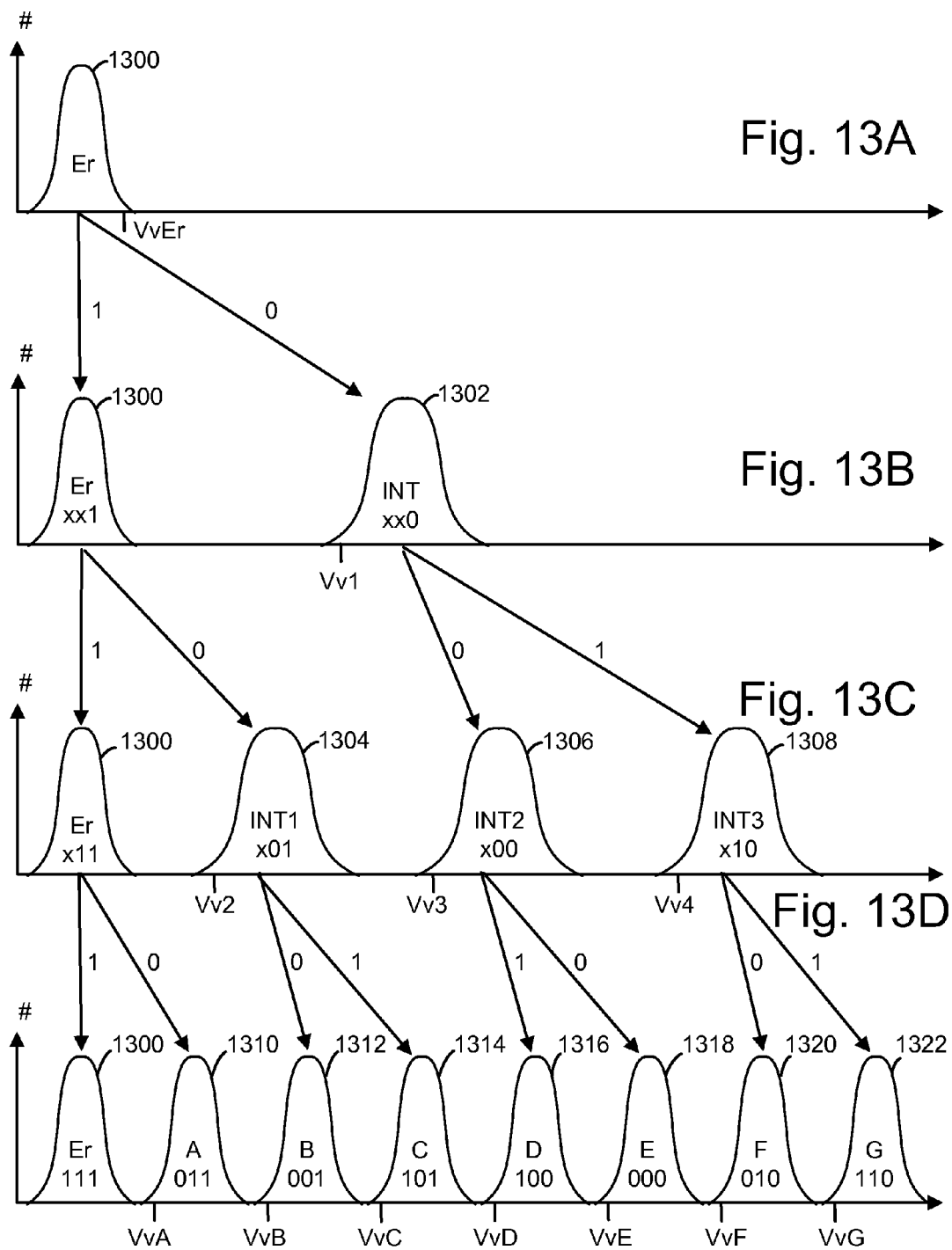
FIG. 13A to 13D depict Vth distributions of memory cells in a three-pass programming operation with eight data states, consistent with FIG. 9A.

FIG. 13A to 13D depict Vth distributions of memory cells in a three-pass programming operation with eight data states, consistent with FIG. 9A. Programming of lower, middle and upper pages in three-bit, eight-level memory cells is depicted. Seven programmed data states A through G are used in addition to Er for eight states total. Initially, all memory cells are in the Er state, represented by the Vth distribution 1300 (FIG. 13A). The lower page (LP) is programmed in FIG. 13B. If LP=1, memory cells in distribution 1300 remain in that distribution. If LP=0, memory cells in distribution 1300 are programmed to an interim distribution 1302 using Vv1. The middle page is programmed in FIG. 13C. If MP=1, memory cells in distribution 1300 remain in that distribution, and memory cells in distribution 1302 are programmed to interim distribution 1308 using verify voltage Vv4. If MP=0, memory cells in distribution 1300 are programmed to interim distribution 1304 using verify voltage Vv2, and memory cells in distribution 1302 are programmed to interim distribution 1306 using verify voltage Vv3.

The upper page (UP) is programmed in FIG. 13D. If UP=1, memory cells in distribution 1300 remain in that distribution, memory cells in distribution 1304, 1306 or 1308 are programmed to distribution 1314 (state C), distribution 1316 (state D), or distribution 1322 (state G), respectively.

If UP=0, memory cells in distribution 1300, 1304, 1306 or 1308 are programmed to distribution 1310 (state A), distribution 1312 (state B), distribution 1318 (state E) and distribution 1320 (state F), respectively. Programming using four bits per cell (16 levels) can similarly involve four pages.

FIG. 14A to 14C depict Vth distributions of memory cells in a two-pass programming operation with eight data states, consistent with FIG. 9A. This example differs from FIG. 13A-13D in that one less programming pass is used. Initially, all memory cells are in the Er state, represented by the Vth distribution 1400 (FIG. 14A). The lower page is programmed in FIG. 14B. If LP=1, memory cells in distribution 1400 remain in that distribution. If LP=0, memory cells in distribution 1400 are programmed to an interim distribution 1402 using Vv1. The middle and upper pages are programmed together in FIG. 14C. If UP/MP=11, memory cells in distribution 1400 remain in that distribution. If UP/MP=01, 00 or 10, memory cells in distribution 1400 are programmed to final Vth distributions 1410, 1412 and 1414, respectively. If UP/MP=10, 00, 01 or 11, memory cells in the Vth distribution 1402 are programmed to final Vth distributions 1416, 1418, 1420 and 1422, respectively.

Figure 15:
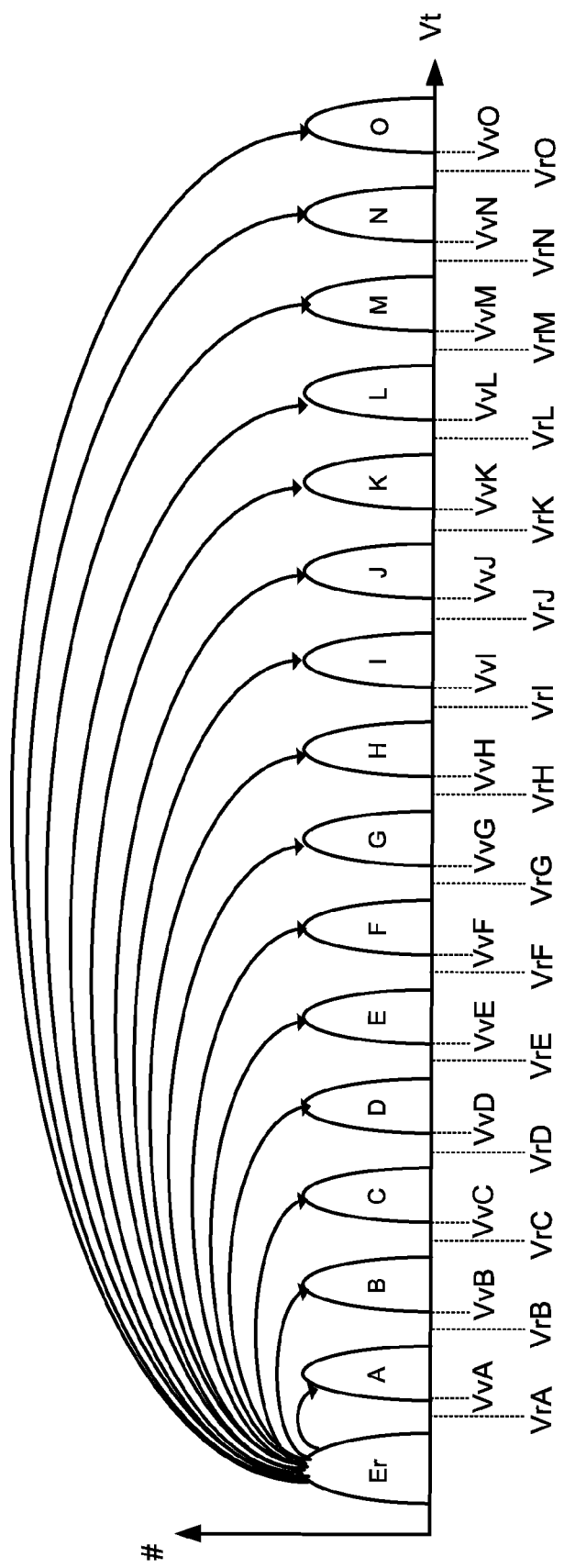
FIG. 15 depicts Vth distributions of memory cells in a one-pass programming operation with sixteen data states, consistent with FIG. 9A.

FIG. 15 depicts Vth distributions of memory cells in a one-pass programming operation with sixteen data states, consistent with FIG. 9A. This example uses fifteen verify reference voltages, VvA, VvB, VvC, VvD, VvE, VvF, VvG, VvH, VvI, VvJ, VvK, VvL, VvM, VvN and VvO and fifteen corresponding read voltages VrA, VrB, VrC, VrD, VrE, VrF, VrG, VrH, VrI, VrJ, VrK, VrL, VrM, VrN and VrO.

In one embodiment, known as full sequence programming, memory cells can be programmed from the erased data state Er directly to any of the programmed data states A-O in a single programming pass, as represented by the arrows. For example, a population of memory cells to be programmed may first be erased so that all memory cells in the population are in erased data state. Then, a programming operation is used to program memory cells directly into the data states.

FIG. 16A to 16E depict Vth distributions of memory cells in a four-pass programming operation with sixteen data states, consistent with FIG. 9A. The data states are labeled as states 0-15 (FIG. 16E). In this example, each memory cell stores four bits of data. Prior to programming, all of the memory cells for a block will be erased into an erased Vth distribution. For example, FIG. 9A shows a block of memory cells in an erased Vth distribution (data state).

In the first programming pass of FIG. 9B, those memory cells to be eventually programmed to data states 0 through 7 as their final or target data state will be programmed to a low Vth distribution which is below the Vth distribution for state 0. For example, FIG. 9B shows those memory cells being programmed to intermediate Vth distribution LM01. The group of memory cells to be eventually programmed to data states 8 through 15 will be programmed to an intermediate Vth distribution LM02. In one embodiment, Vth distribution LM02 is not greater than the Vth for data state 7. Between programming voltages of this first pass, two verify operations are performed: one for LM01 and one for LM02. Thus, between program voltages, two verify voltages will be used. It may be possible to only use one verify voltage (for LM01 only) at the beginning of the program process until at least one memory cell has reached LM01, at which time the system will use two verify voltages. In other embodiments, the first programming pass can program to more than two Vth distributions. In one embodiment, data is erased to state 0 and memory cells to be eventually programmed to data states 8 through 15 will be programmed to an intermediate Vth distribution, while memory cells to be eventually programmed to data states 0 through 7 will remain in state 0. In another embodiment, LM01 can slightly overlap with the erased Vth distribution E since the ECC can handle a certain percentage of memory cells that are in error. Thus, the programming pass can end when all but K bits have verified, with K being a number that can be corrected by ECC.

The second programming pass is depicted in FIG. 9C. Those memory cells to be programmed to data states 0 through 3 will be programmed from LM01 to Vth distribution LM11. For example, FIG. 9C shows Vth distributions LM01 (dotted) and LM11 (solid line). Memory cells to be eventually programmed to data states 3 through 7 will be programmed from LM01 to intermediate Vth distribution LM12. Memory cells that are to eventually be programmed to data states 8 through 11 will be programmed from LM02 to intermediate Vth distribution LM13. Those memory cells that are eventually to be programmed to data states 12 through 15 will be programmed from LM02 to intermediate Vth distribution LM14. During the second programming pass, up to four verify operations need to be performed between programming voltages: one verify operation for LM11, one verify operation for LM12, one verify operation for LM13 and one verify operation for LM14. Therefore, between each programming voltage, there will be up to four verify voltages. It may be possible, in some embodiments, to reduce the number of verify voltages by using an intelligent scheme for determining when it is possible to omit some of the verify voltages because no memory cells could be near a particular target. Because the ECC can handle a certain percentage of memory cells that are in error, in another embodiment LM11 can overlap with LM12 and LM13 can overlap with LM14. Additionally, LM12 can overlap with LM01 or LM02, and LM14 can overlap with LM02. Thus, the programming pass can end when all but K bits have verified, with K being a number that can be corrected by ECC.

The third programming pass is depicted in FIG. 9D. Those memory cells that are eventually to be programmed to data state 0 and 1 will be programmed from LM11 to intermediate Vth distribution LM21. Those memory cells that will be programmed to data states 2 and 3 are programmed from LM11 to intermediate Vth distribution LM22. Those memory cells to be programmed to data states 4 and 5 are programmed from LM12 to intermediate Vth distribution LM23. Those memory cells to be programmed to data states 6 and 7 are programmed from LM12 to intermediate Vth distribution LM24. Those memory cells to be programmed to data states 8 and 9 are programmed from LM13 to intermediate Vth distribution LM25. Those data cells to be programmed to data states 10 and 11 are programmed from LM13 to intermediate Vth distribution LM26. Those data cells to be programmed to data states 12 and 13 are programmed from LM14 to intermediate Vth distribution LM27. Those memory cells to be programmed to data states 14 and 15 are programmed from LM14 to intermediate Vth distribution LM28. Because the ECC can handle a certain percentage of memory cells that are in error, in another embodiment neighboring LM2x distributions can overlap with each other (e.g., LM26 can overlap with LM25). Additionally, LM2x distributions can also overlap with LM1x distributions (e.g., LM26 can overlap with LM13). Thus, the programming pass can end when all but K bits have verified, with K being a number that can be corrected by ECC.

The fourth (and final) programming pass is depicted in FIG. 9E. In the fourth programming pass, memory cells are programmed as follows: data state 0—from LM21 to data state 0, data state 1—from LM21 to data state 1, data state 2—from LM22 to data state 2 data state 3—from LM22 to data state 3 data state 4—from LM23 to data state 4 data state 5—from LM23 to data state 5 data state 6—from LM24 to data state 6 data state 7—from LM24 to data state 7 data state 8—from LM25 to data state 8 data state 9—from LM25 to data state 9 data state 10—from LM26 to data state 10 data state 11—from LM26 to data state 11 data state 12—from LM27 to data state 12 data state 13—from LM27 to data state 13 data state 14—from LM28 to data state 14 data state 15—from LM28 to data state 15. As discussed above, another embodiment includes data states 0-15 overlapping at the end of the programming process. Other embodiments may include intermediate LM states that overlap with one another, especially if the binary version of the data remains until the entire block goes through the entire programming sequence. Other variations of the four pass programming process can also be used. Additionally, other multi-pass programming processes can also be used.

FIG. 17A depicts an example word line programming order in which (1) WLn is fully programmed before (2) programming a next word line WLn+1.

FIG. 17B depicts an example word line programming order in which (1) WLn is programmed a first time, (2) WLn+1 is programmed a first time, (3) WLn is programmed a second and final time, (4) WLn+2 is programmed a first time, (5) WLn+1 is programmed a second and final time, and so forth.

FIG. 17C depicts an example word line programming order in which (1) WLn is programmed a first time, (2) WLn+1 is programmed a first time, (3) WLn is programmed a second time, (4) WLn+2 is programmed a first time, (5) WLn+1 is programmed a second time, (6) WLn is programmed a third and final time, (7) WLn+3 is programmed a first time, (8) WLn+2 is programmed a second time, (9) WLn+1 is programmed a third and final time, and so forth.

Accordingly, it can be seen that, in one embodiment, an apparatus comprises: a block of memory cells, the block comprising memory cells connected to a plurality of word lines, including a selected word line and an adjacent word line, adjacent to the selected word line, the adjacent word line is configured to be programmed after the selected word line in a word line programming order; and a control circuit. The control circuit comprising: a programming circuit configured to perform a programming operation for memory cells connected to the selected word line; a determination circuit configured to determine whether the memory cells connected to the selected word line reach a programming milestone; and in response to one or more memory cells failing to reach the programming milestone, the determination circuit initiating a test of the adjacent word line, the test configured to determine an extent to which memory cells connected to the adjacent word line are inadvertently programmed.

In another embodiment, a method comprises: performing a programming pass for memory cells connected to a selected word line, wherein the programming pass is successfully completed after a number of program loops; determining that the number of program loops exceeds a specified number; and in response to the determining that the number of program loops exceeds the specified number: determining a count of memory cells connected to an adjacent word line having a threshold voltage above a read voltage, wherein the adjacent word line is adjacent to the selected word line and after the selected word line in a programming order; and if the count exceeds a bit count limit, performing a recovery operation for the memory cells of the selected word line and preventing future programming of the adjacent word line.

In another embodiment, an apparatus such as a memory device comprises means for performing each of the steps in the above-mentioned method.

In another embodiment, an apparatus comprises: a block of memory cells, the block comprising memory cells connected to a plurality of word lines, including a selected word line and an adjacent word line, adjacent to the selected word line; and a control circuit. The control circuit is configured to: erase the block using an erase-verify voltage; perform a programming pass for memory cells connected to the selected word line; based on a progress of the programming pass, make a determination of whether a soft short circuit exists between the selected word line and the adjacent word line, the determination, comprises an evaluation of a threshold voltage distribution of memory cells connected to the adjacent word line relative to the erase-verify voltage; based on the evaluation, make a conclusion of whether the soft short circuit exists; and if the conclusion is that the soft short circuit exists, take a corrective action. The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a block of memory cells, the block comprising memory cells connected to a plurality of word lines, including a selected word line and an adjacent word line, adjacent to the selected word line, the adjacent word line is configured to be programmed after the selected word line in a word line programming order; and
a control circuit, the control circuit comprising:
   a programming circuit configured to perform a programming operation for memory cells connected to the selected word line;
   a determination circuit configured to determine whether the memory cells connected to the selected word line reach a programming milestone; and
   in response to one or more memory cells failing to reach the programming milestone, the determination circuit initiating a test of the adjacent word line, the test configured to determine an extent to which memory cells connected to the adjacent word line are inadvertently programmed.

2. The apparatus of claim 1, wherein:
the test is configured to determine whether an electrical short circuit exists between the selected word line and the adjacent word line.

3. The apparatus of claim 1, wherein:
the memory cells connected to the adjacent word line comprise memory cells in an erased state;
the test determines a count of the memory cells in the erased state having a threshold voltage above a read voltage; and
the count indicates an extent of an upper tail of a threshold voltage distribution of the memory cells in the erased state.

4. The apparatus of claim 3, wherein:
the control circuit is configured to adjust the read voltage in proportion to a number of program-erase cycles in the block.

5. The apparatus of claim 1, wherein:
the control circuit, to determine whether the memory cells connected to the selected word line reach the programming milestone, is configured to determine whether the programming operation is successfully completed within a loop count limit.

6. The apparatus of claim 5, wherein:
the control circuit is configured to adjust the loop count limit in inverse proportion to a number of program-erase cycles in the block.

7. The apparatus of claim 1, wherein:
the test determines a count of memory cells connected to the adjacent word line which have a threshold voltage above a read voltage and compares the count to a bit count limit; and
the control circuit is configured to adjust the bit count limit in proportion to a number of program-erase cycles in the block.

8. The apparatus of claim 1, wherein:
the programming milestone is reached when at least a specified number of the memory cells connected to the selected word line have completed programming to one data state of a plurality of different data states.

9. The apparatus of claim 1, wherein:
the test determines a count of memory cells connected to the adjacent word line which have a threshold voltage above a read voltage and compares the count to a bit count limit;
in response to the count exceeding the bit count limit, the control circuit is configured to perform a recovery operation; and
to perform the recovery operation, the control circuit is configured to read data from the memory cells connected to the selected word line and store the data in another location.

10. The apparatus of claim 9, wherein:
the control circuit, to perform the recovery operation, is configured to read additional data from the memory cells connected to previously-programmed word lines in the block and store the additional data in another block.

11. The apparatus of claim 1, wherein:
the test determines a count of memory cells connected to the adjacent word line which have a threshold voltage above a read voltage and compares the count to a bit count limit;
in response to the count exceeding the bit count limit, the control circuit is configured to perform a recovery operation; and
to perform the recovery operation, the control circuit is configured to read at least two pages of data from the memory cells connected to the selected word line and read at least one page of data from the memory cells connected to the adjacent word line.

12. The apparatus of claim 1, wherein:
the memory cells connected to the selected word line are programmed in a plurality of programming passes; and
the programming operation comprises one programming pass among the plurality of programming passes.

13. The apparatus of claim 1, wherein:
the block is arranged in a three-dimensional structure.

* * * * *